(12) United States Patent
Slinker et al.

(10) Patent No.: US 12,490,576 B2
(45) Date of Patent: Dec. 2, 2025

(54) 3D-0D PEROVSKITE LIGHT-EMITTING ELECTROCHEMICAL CELLS

(71) Applicant: Board of Regents, The University of Texas System, Austin, TX (US)

(72) Inventors: Jason D. Slinker, Allen, TX (US); Aditya Kumar Mishra, Dallas, TX (US); Riya Bose, Dallas, TX (US); Anton Malko, McKinney, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 462 days.

(21) Appl. No.: 18/059,106

(22) Filed: Nov. 28, 2022

(65) Prior Publication Data
US 2023/0171982 A1    Jun. 1, 2023

Related U.S. Application Data

(60) Provisional application No. 63/283,412, filed on Nov. 26, 2021.

(51) Int. Cl.
| | |
|---|---|
| *H10K 50/135* | (2023.01) |
| *C09K 11/08* | (2006.01) |
| *C09K 11/66* | (2006.01) |
| *H10K 71/15* | (2023.01) |
| *H10K 71/40* | (2023.01) |
| *H10K 85/10* | (2023.01) |

(52) U.S. Cl.
CPC ........ *H10K 50/135* (2023.02); *C09K 11/0833* (2013.01); *C09K 11/665* (2013.01); *H10K 71/15* (2023.02); *H10K 71/441* (2023.02); *H10K 85/111* (2023.02); *H10K 85/1135* (2023.02)

(58) Field of Classification Search
CPC .......................... C09K 11/665; C09K 11/0833
See application file for complete search history.

(56) References Cited

U.S. PATENT DOCUMENTS

| | | | |
|---|---|---|---|
| 2019/0169498 A1* | 6/2019 | Saidaminov | C09K 11/665 |
| 2022/0102634 A1* | 3/2022 | Kim | C09K 11/665 |
| 2023/0225140 A1* | 7/2023 | Im | H10F 77/12 |
| | | | 252/301.4 H |

OTHER PUBLICATIONS

Alahbakhshi, Masoud et al., "Bright and Effectual Perovskite Light-Emitting Electrochemical Cells Leveraging Ionic Additives, ACS Energy Letters", 2019, 4, pp. 2922-2928.
(Continued)

*Primary Examiner* — Erik Kielin
(74) *Attorney, Agent, or Firm* — SALIWANCHIK, LLOYD & EISENSCHENK

(57) ABSTRACT

Active emissive layers (e.g., of a light-emitting electrochemical cell (LEC)) are provided and can comprise zero-dimensional (0D) perovskite material in combination with a three-dimensional (3D) perovskite material, as well as electroluminescent devices (e.g., LECs) utilizing such active emissive layers and methods of fabricating and using such active emissive layers and electroluminescent devices. The 0D perovskite material can be incorporated into a matrix film of the 3D perovskite material. The 0D perovskite material can be, for example, perovskite nanocrystals (PNCs). The 0D perovskite material can be, for example, $Cs_4PbBr_6$, and the 3D perovskite material can be, for example, $CsPbBr_3$.

9 Claims, 15 Drawing Sheets

(56) References Cited

OTHER PUBLICATIONS

Zhang, Yuhai et al., "Emergence of multiple fluorophores in individual cesium lead bromide nanocrystals", Nature Communications 10.1 (2019): 2930.

* cited by examiner

| Sample (%LiPF6) | $C_{GEO}$ (nF) | Thickness (nm) | Dielectric Constant | $C_{EDL1}$ (nF) | $C_{EDL2}$ (nF) | EDL1 (nm) | EDL2 (nm) | Electrical Conductivity (Sm$^{-1}$) |
|---|---|---|---|---|---|---|---|---|
| 3D | 3.25 | 125 | 15.3 | 83 | 71 | 4.88 | 5.7 | 8.47E-05 |
| 3D-0D | 2.31 | 125 | 10.8 | 96 | 85 | 2.98 | 3.3 | 1.48E-04 |

| Sample | Max. Luminance | Max. Current Efficiency | Max. Power Efficiency | Max. EQE |
|---|---|---|---|---|
| 3D | 6564 | 10.8 | 11.6 | 2.7 |
| 3D-0D-High (7wt%) | 11193 | 32.96 | 30.17 | 8.25 |
| 3D-0D-low | 7300 | 16.38 | 14.34 | 4.21 |
| 5 wt% | 9277 | 18.01 | 18.52 | 4.51 |
| 9 wt% | 10502 | 12.04 | 10.13 | 3.01 |
| 12 wt% | 9068 | 8.01 | 6.74 | 2 |
| 2 to 1 (CsBr to PbBr$_2$) | 3432 | 10.2 | 9.6 | 2.55 |
| 3 to 1 (CsBr to PbBr$_2$) | 2518 | 8.9 | 6.8 | 2.3 |

Figure 13

| Device structure | Single (S) or multilayer (M) | Light Emitting Mechanism | Turn on voltage (V) | Device Stability with operation condition | Ref |
|---|---|---|---|---|---|
| ITO / Pero-PEO-composite /In (Ga,Au) | S | LED | 3 | 1 hr (L30) at constant 2.7 V | [1] |
| ITO/ZnO/PVP/perovskite/CBP/MoOx/Al | M | LED | ~3 | 0.03 h (L50) at constant 5V driving | [2] |
| ITO/PEDOT:PSS/perovskite/SPW111/LiF/Ag | M | LED | 2.4 | 3.9 h (L70) | [3] |
| ITO/PolyTPD/FAPbBr$_3$/TpBi/LiF/Al | M | LED | 4 | 0.1 h (EQE50) at constant 10 mA/cm$^2$ | [4] |
| Au/p-MgNiO/CsPbBr$_3$/PMMA/n-MgZnO/n$^+$-GaN | M | LED | ~4 | 10 h (L80) | [5] |
| ITO/PEDOT:PSS/MAPbBr$_3$/B$_3$PYMPM:TpBi/B3PYMPM:Cs$_2$CO$_3$/Al | M | LED | ~3 | 0.1 h (L50) | [6] |
| ITO/PEDOT:PSS/CsPbBr$_3$:MABr/B$_3$PYMPM/LiF/Al | M | LED | ~2.7 | 100 h @ 100 cd/m$^2$ (L50) with constant 5mA | [7] |
| ITO/NiO$_x$+PVK+TFB/CsPbBr$_3$+LiBr/TpBi/LiF/Al | M | LED | ~2.4 | 108 h @ 100 cd/m$^2$ (L50) | [8] |
| ITO/PEDOT:PSS/CsPbBr$_3$: PEO: LiPF$_6$: LiF/Al | S | LEC | 1.95 | 27.6 h @ 3260 cd/m$^2$ (L50) at 50 mA/cm$^2$ Extrapolated 6700 h @ 100 cd/m$^2$ | [9] |
| ITO/PEDOT:PSS/PFI/PeMOF/TPBi/LiF/Al | M | LED | 3.8 | 30 h @ 710 cd/m$^2$ (L50) at 25 mA/cm$^2$ Extrapolated: ~950 h @ 100 cd/m$^2$ | [10] |
| ITO/PEDOT:PSS/CsTFA:CsPbBr$_3$/TPBi/LiF/Al | M | LED | 2.8 | Half-life ~ 250 h @ 100 cd/m$^2$ | [11] |
| Our Work | S | LEC | 2.3-2.4 | 46 h @ 3640 cd/m$^2$ (L50) at 33 mA/cm$^2$ 129 h @ 1530 cd/m$^2$ (L50) at 10 mA/cm$^2$ Extrapolated ~7700-10000 h @ 100 cd/m$^2$ | |

(LXX refers to a decay to XX% of peak luminance.)

Figure 14

3D-0D PEROVSKITE LIGHT-EMITTING ELECTROCHEMICAL CELLS

CROSS-REFERENCE TO RELATED APPLICATION

This application claims the benefit of U.S. Provisional Application Ser. No. 63/283,412, filed Nov. 26, 2021, the disclosure of which is hereby incorporated by reference in its entirety, including any figures, tables, and drawings.

GOVERNMENT SUPPORT

This invention was made with government support under Grant No. ECCS1906505 awarded by the National Science Foundation. The government has certain rights in the invention.

BACKGROUND

In recent years, lead halide perovskites have been extensively used due to high absorption coefficients, long carrier diffusion lengths, and defect tolerance, leading to good performance in thin-film optoelectronics. Compared to hybrid organic-inorganic perovskites, inorganic perovskites offer improved chemical and thermal stability while retaining most of the advantageous properties.

BRIEF SUMMARY

Embodiments of the subject invention provide novel and advantageous active emissive layers (e.g., of a light-emitting electrochemical cell (LEC)) that comprise zero-dimensional (0D) (i.e., particles with a largest dimension on the nanometer (nm) scale) perovskite material in combination with a three-dimensional (3D) perovskite material, as well as electroluminescent devices (e.g., LECs) utilizing such active emissive layers and methods of fabricating and using such active emissive layers and electroluminescent devices. The electroluminescent device can be a single-layer perovskite LEC (PeLEC) and comprise the active emissive layer as the only active layer and/or only perovskite layer of the device. The 0D perovskite material can be incorporated into a matrix film of the 3D perovskite material. The 0D perovskite material can be, for example, perovskite nanocrystals (PNCs). The 0D perovskite material can be, for example, $Cs_4PbBr_6$ (e.g., $Cs_4PbBr_6$ PNCs), and the 3D perovskite material can be, for example, $CsPbBr_3$, though embodiments are not limited thereto.

In an embodiment, an active emissive layer configured for use in a light-emitting electrochemical cell can comprise: a 3D perovskite material; and a luminescent 0D perovskite material embedded in the 3D perovskite material. The 0D perovskite material can comprise PNCs. The PNCs can be uniformly distributed in the 3D perovskite material. The 3D perovskite material can be a 3D perovskite material matrix. The 0D perovskite material can comprise cesium lead halide particles, and/or the 3D perovskite material can comprise crystalline $CsPbX_3$ (where X=Cl, Br, or I). For example, the 0D perovskite material can comprise $Cs_4PbBr_6$, and/or the 3D perovskite material can comprise $CsPbBr_3$. The active emissive layer can have a surface roughness (RMS) of, for example, not greater than 22 nanometers (nm).

In another embodiment, an LEC can comprise an active emissive layer as disclosed herein. The LEC can also comprise an anode and a cathode, with the active emissive layer sandwiched between the anode and the cathode. The LEC can be configured to provide: a maximum external quantum efficiency (EQE) of at least 3.0%; a maximum power efficiency of at least 11.8 Lm/W; a maximum luminance of at least 3200 $cd/m^2$ under 33.3 $mA/cm^2$ operation; a luminance half-life of at least 34.0 hours under 33.3 $mA/cm^2$ operation; a steady state voltage of not greater than 2.9 V at a constant current density of 33.3 $mA/cm^2$; a leakage current of not greater than 0.09 $mA/cm^2$; a conductivity of at least 90 $\mu S/m$; a dielectric constant of not greater than 15.0; and/or a geometric capacitance of not greater than 3.20 nF.

In another embodiment, a method of fabricating an active emissive layer configured for use in an LEC can comprise: a) providing an intermediate 3D thin film formed from a 3D perovskite precursor in a first solvent (e.g., dimethyl sulfoxide (DMSO)); b) modifying the intermediate 3D thin film to obtain a 3D-0D thin film by incorporating therein a pre-synthesized 0D PNC material dispersed in an orthogonal solvent (e.g., hydrofluoroether (HFE) orthogonal solvent); and c) annealing the 3D-0D thin film to obtain the active emissive layer configured for use in the LEC. The 3D perovskite precursor can comprise $CsPbX_3$ (where X=Cl, Br, or I), and the $CsPbX_3$ can be obtained from a mixture of $CsX:PbX_2$, at a first ratio (e.g., of 1.5:1 or about 1.5:1). The 3D perovskite precursor can comprise $CsPbBr_3$, and the $CsPbBr_3$ can be obtained from a mixture of $CsBr:PbBr_2$, at a first ratio (e.g., of 1.5:1 or about 1.5:1). The pre-synthesized 0D PNC material can be luminescent before it is incorporated into the intermediate 3D thin film. A normalized photoluminescence (PL) intensity of the pre-synthesized 0D PNC material can be the same or about the same as a normalized PL intensity of a 3D material of the intermediate 3D thin film. Step b) can comprise distributing 0D PNCs of the 0D PNC material dispersed in the orthogonal solvent into the intermediate 3D thin film by rotating the intermediate 3D thin film while the orthogonal solvent is provided thereto. Step c) can comprise at least one of: vacuum annealing the 3D-0D thin film; and thermal annealing the 3D-0D thin. The method can further comprise, after step c), sandwiching the active emissive layer between an anode and a cathode of the LEC.

BRIEF DESCRIPTION OF DRAWINGS

FIGS. 4(b1)-4(b3) show plots of count versus grain size (in nm) showing size distribution analysis for various perovskite thin films, according to embodiments of the subject invention. FIGS. 4(b1)-4(b3) are for 3D-0D (high PLQY) perovskites, a 3D-only ($CsBr:PbBr_2$=1.5:1) film, and a film cast from a different precursor ratio ($CsBr:PbBr_2$=3:1), respectively.

FIGS. 10(a)-10(f) are for 3D-0D (high PLQY), 3D-0D (low PLQY), 3D, $CsBr:PbBr_2=1.2:1$, $CsBr:PbBr_2=2:1$, and $CsBr:PbBr_2=3:1$, respectively.

FIG. 13 shows a table of a summary of luminance and efficiency characteristics of 3D and 3D-0D PeLECs, according to an embodiment of the subject invention.

FIG. 14 shows a table of comparative performances of the best-in-class perovskite-based light emitting diodes (LEDs) and light-emitting electrochemical cells (LECs) with respect to an embodiment of the subject invention.

DETAILED DESCRIPTION

Figures 1A, 1B, 1C, 1D:
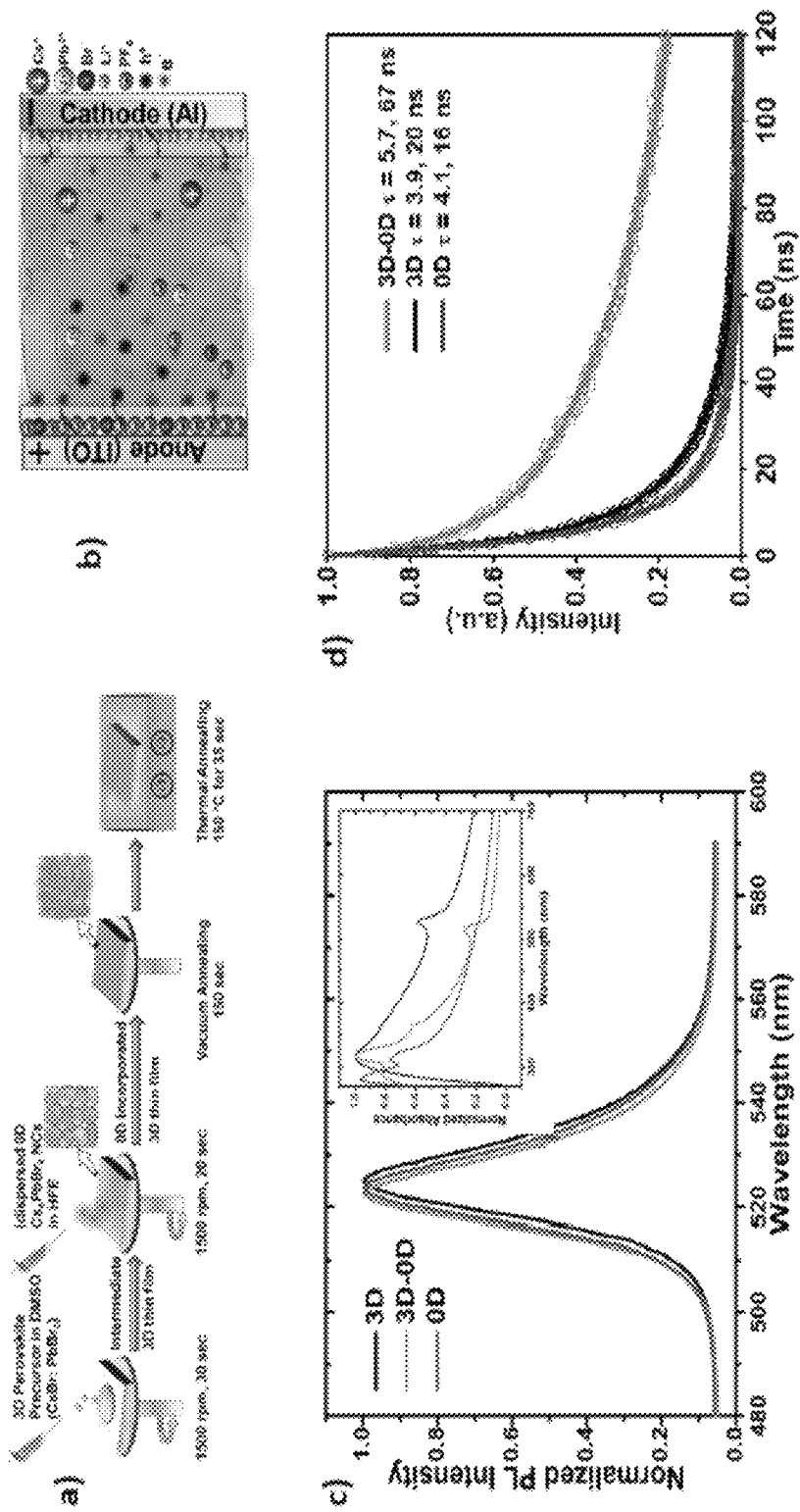
FIG. 1(a) shows an illustration of a fabrication method for dispersing zero-dimensional (0D) perovskites in a three-dimensional (3D) matrix, according to an embodiment of the subject invention.
FIG. 1(b) shows an illustration of the ionic redistribution and charge dynamics in perovskite light-emitting electrochemical cells (PeLECs), according to an embodiment of the subject invention.
FIG. 1(c) shows a plot of normalized steady-state photoluminescence (PL) intensity versus wavelength (in nanometers (nm)) for 0D, 3D, and 3D-0D perovskite composite thin films, according to embodiments of the subject invention. The curves with the lowest, second-lowest, and highest PL intensity values at 540 nm are for 3D-0D, 0D, and 3D, respectively. The inset shows absorbance spectra of 0D, 3D, and 3D-0D perovskite composite thin films; the curves with the lowest, second-lowest, and highest absorbance values at 600 nm are for 3D-0D, 0D, and 3D, respectively.
FIG. 1(d) shows a plot of normalized time-resolved PL versus time (in nanoseconds (ns)) for 0D, 3D, and 3D-0D perovskite composite thin films, according to an embodiment of the subject invention. The curves with the shortest, second-shortest, and longest PL lifetime values are for 0D, 3D, and 3D-0D, respectively.

Embodiments of the subject invention provide novel and advantageous active emissive layers (e.g., of a light-emitting electrochemical cell (LEC)) that comprise zero-dimensional (0D) (i.e., particles with a largest dimension on the nanometer (nm) scale) perovskite material in combination with a three-dimensional (3D) perovskite material, as well as electroluminescent devices (e.g., LECs) utilizing such active emissive layers and methods of fabricating and using such active emissive layers and electroluminescent devices. The electroluminescent device can be a single-layer perovskite LEC (PeLEC) and comprise the active emissive layer as the only active layer and/or only perovskite layer of the device. The 0D perovskite material can be incorporated into a matrix film of the 3D perovskite material. The 0D perovskite material can be, for example, perovskite nanocrystals (PNCs). The 0D perovskite material can be, for example, $Cs_4PbBr_6$ (e.g., $Cs_4PbBr_6$ PNCs), and the 3D perovskite material can be, for example, $CsPbBr_3$, though embodiments are not limited thereto.

In an embodiment, an emissive layer in a single-layer PeLEC can comprise highly luminescent 0D $Cs_4PbBr_6$ PNCs incorporated into a 3D $CsPbBr_3$ matrix film. The 0D cesium lead halide perovskite $Cs_4PbBr_6$ has highly efficient robust green emission compared to its three-dimensional (3D) $CsPbBr_3$ counterpart. Though research has been devoted to identifying the origin of the green emission as intrinsic or arising from 3D $CsPbBr_3$ impurities, the advantages of the superior photoluminescence properties for practical light-emitting devices have until now remained elusive. $Cs_4PbBr_6$ has been employed in the related art only as a higher-bandgap non-luminescent matrix to passivate or provide quantum/dielectric confinement to $CsPbBr_3$ in light-emitting devices and to enhance its photo/thermal/environmental stability. In order to resolve this disparity, embodiments of the subject invention can utilize a novel solvent engineering method to incorporate highly luminescent 0D $Cs_4PbBr_6$ PNCs into a 3D $CsPbBr_3$ film, forming the active emissive layer in single-layer PeLECs. Such active emissive layers lead to a dramatic increase in the maximum external quantum efficiency (EQE) and luminance from 2.7% and 6050 candelas per square meter ($cd/m^2$) for a 3D-only PeLEC to 8.3% and 11200 $cd/m^2$ for a 3D-0D PNC device with only 7% by weight of 0D PNCs. The majority of this increase is driven by efficient inherent emission of 0D nanocrystals, while the concomitant morphology improvement also contributes to reduced leakage current, reduced hysteresis, and enhanced operational lifetime (half-life of 129 hours (hr)), making this one of the best-performing LECs in existence.

The impelling force of materials science research comes from the diverse applicability of the materials to improve and even revolutionize technologies. In recent years, lead halide perovskites have been a choice material, exhibiting high absorption coefficients, long carrier diffusion lengths, and defect tolerance, leading to skyrocketing performance in thin-film optoelectronics. Compared to hybrid organic-inorganic perovskites, inorganic perovskites offer improved chemical and thermal stability while retaining most of the advantageous properties. In particular, cesium lead halide perovskites ($CsPbX_3$, where X=Cl, Br, or I) have gained significant attention for light-emitting applications because of their high photoluminescence (PL) quantum yield (QY), color-purity, widely tunable emission, and facile solution processability. However, related art $CsPbX_3$ light-emitting devices still suffer from fast excitonic decay due to weakly bound excitons that can be easily thermally dissipated and diffused with lattice vibration, thereby being trapped by non-radiative defect states, which arise due to their labile surface as well as environmental factors. This rapid excitonic decay renders the photoluminescence quantum yield (PLQY) sensitive to the material form and requires additional defect passivation/encapsulation strategies such as embedding in polymer additives, incorporating dopants, and engineering ligand shells to circumvent this issue.

Contrary to the 3D perovskites $CsPbX_3$, where the $[PbX_6]^{4-}$ octahedra are corner shared along all three dimensions, isolation of octahedra in 0D $Cs_4PbX_6$ leads to an increase in exciton binding energy and, consequently, a remarkable enhancement of PL intensity that remains in the solid-state along with superior environmental stability. The origin of the emission in 0D perovskites, which spectrally is nearly identical to the 3D perovskites despite the higher bandgap of the former, has been thought to be due to the embedded 3D impurities. However, more recently the presence of 3D impurities has been ruled out by intensive structural characterization and the origin of the emission has been attributed to the presence of molecular-like intra-bandgap defects. In particular, 0D $Cs_4PbBr_6$ has been extensively studied from both theoretical and experimental aspects, and it has been observed that Br vacancies ($V_{Br}$) in 0D $Cs_4PbBr_6$ have a low formation energy and can induce a mid-gap energy level appropriate to achieve the green emission. Non-emissive $Cs_4PbBr_6$ has been used as a matrix to encapsulate $CsPbBr_3$, as it can passivate the surface by endotaxy without any resulting strain. Such a non-luminescent 0D phase restricts the growth of $CsPbBr_3$ crystallites, leading to increased confinement and enhancement of exciton binding energy. $Cs_4PbBr_6$, being a higher bandgap material, can also provide type-I confinement to $CsPbBr_3$, thereby restricting the carriers within the $CsPbBr_3$ region and reducing the probability of electron leakage, or can provide dielectric confinement to the 3D part, enhancing its oscillator strength and absorption cross-section. Energy transfer from the 0D to 3D can also occur. Overall, reducing non-radiative losses and facilitating radiative recombination significantly enhances the EQE of $CsPbBr_3$ light-emitting devices. Additionally, it also improves the photo, thermal, and environmental stability of the devices, resulting in longer operational lifetimes.

Regardless of the efforts to identify the origin of the emission, the related art has not implemented the propitious emission properties of $Cs_4PbBr_6$ in light-emitting devices. In an embodiment, a novel solvent engineering method can be used to incorporate highly emissive 0D perovskite nanocrystals (PNCs) into a 3D perovskite composite film to form the emissive layer in single-layer PeLECs. The 3D perovskite composite film can comprise a perovskite material, an electrolyte, and a salt (e.g., $CsPbBr_3$, a polyelectrolyte, and Li salt). LECs utilize mobile ion redistribution to enhance charge injection and produce efficient emission from solution-processible single-layer devices. Incorporation of an optimized concentration of highly luminescent (e.g., PLQY ~70%) 0D PNCs in a 3D perovskite matrix (e.g., $CsPbBr_3$ matrix) can dramatically improve virtually all of the PeLEC optoelectronic properties. In particular, PeLECs utilizing these highly emissive 0D PNCs exhibit a maximum luminance of 11200 $cd/m^2$, a maximum power efficiency of 33.0 lumens per Watt (Lm/W), a maximum external quantum efficiency of 8.3%, and a long luminescence half-life of 129 hr when operated at a current density of 10 milliamps per square centimeter ($mA/cm^2$). The rationale for this enhancement has been established by a detailed analysis of the photoluminescence and electroluminescence of various film and device formulations coupled with morphological and structural evaluation by microscopy and diffraction.

Figures 8A, 8B:
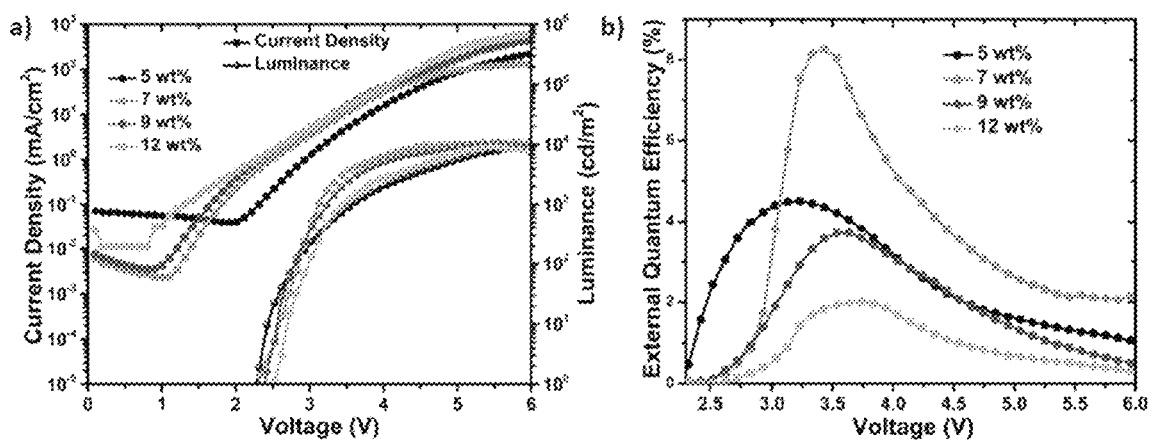
FIG. 8(a) shows a plot of current density (in $mA/cm^2$; left y-axis) and luminance (in $cd/m^2$; right y-axis) versus voltage (V) for 3D-0D PeLECs with various concentrations of 0D perovskite nanoparticles, according to an embodiment of the subject invention. The curves with the lowest, second-lowest, third-lowest, and highest current density values at 0.5 V are for 7 wt %, 9 wt %, 12 wt %, and 5 wt %, respectively. The curves with the lowest, second-lowest, third-lowest, and highest luminance values at 4 V are for 5 wt %, 12 wt %, 9 wt %, and 7 wt %, respectively.
FIG. 8(b) shows a plot of EQE (in %) versus voltage (V) for 3D-0D PeLECs with various concentrations of 0D perovskite nanoparticles, according to an embodiment of the subject invention. The curves with the lowest, second-lowest, third-lowest, and highest EQE values at 3.25 V are for 12 wt %, 9 wt %, 5 wt %, and 7 wt %, respectively.
Figures 9A, 9B, 9C, 9D, 9E, 9F:
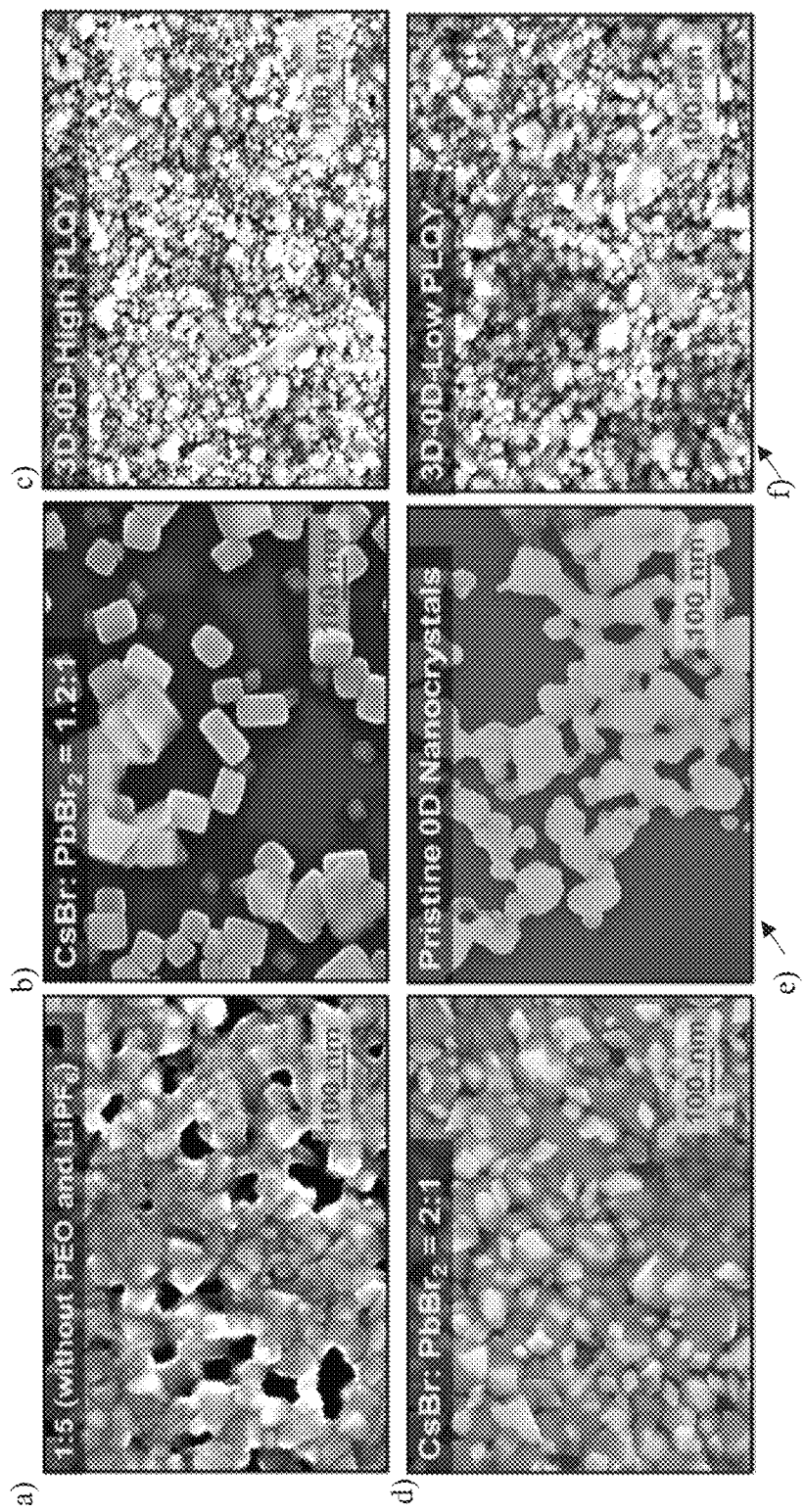
FIGS. 9(a)-9(f) show SEM images of films of 0D and 3D-0D perovskite films of various formulations, according to embodiments of the subject invention. The scale bar for each of the images in FIGS. 9(a)-9(f) is 100 nm.
Figures 10A, 10B, 10C, 10D, 10E, 10F:
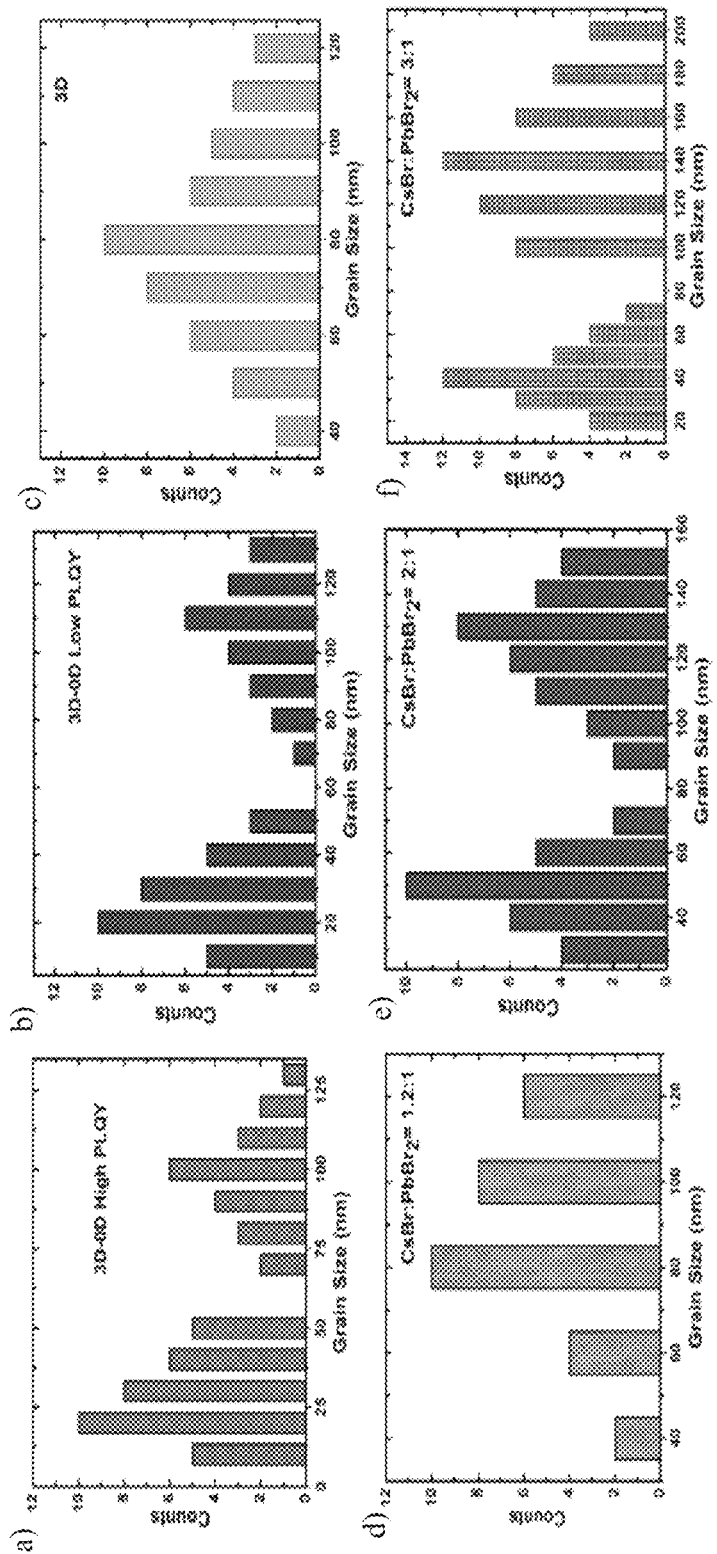
FIGS. 10(a)-10(f) show plots of count versus grain size (in nm) showing size distribution analysis for various perovskite thin films, according to embodiments of the subject invention.

FIG. 1(a) shows a method of fabricating 3D-0D PNC LECs, according to an embodiment of the subject invention. Because the morphology of the film is a crucial component to ensure optimum device performance, a major challenge overcome by the inventors of the subject invention was to distribute the 0D PNCs uniformly into the 3D matrix while retaining its crystal structure network. In order to achieve this, a procedure used to fabricate standard 3D perovskite LECs was modified. Typically, a precursor solution of the 3D $CsPbBr_3$ ($CsBr:PbBr_2$, mixing ratio of 1.5:1), poly (ethylene oxide) (PEO) electrolyte, and $LiPF_6$ salt additive was spin-cast from dimethyl sulfoxide (DMSO) solution onto glass slides bearing the modified bottom electrode of indium tin oxide (ITO)/poly(3,4-ethylenedioxythiophene) polystyrene sulfonate (PEDOT:PSS) (ITO/PEDOT-PSS). Addition of this polyelectrolyte and salt of highly mobile ions is advantageous to attain differentiated ion motion in PeLECs: selective motion of the additive ions to maintain the perovskite ionic crystal, as illustrated in FIG. 1(b). Once this film was set, pre-synthesized 0D $Cs_4PbBr_6$ PNCs (synthesized following Zhang et al., Phys. Chem. Lett. 2017, 8, 961-965; which is hereby incorporated herein by reference in its entirety) in different weight ratios (see also FIGS. 8(a), 8(b), and 13) were introduced utilizing a hydrofluoroether (HFE) "orthogonal solvent," a solvent that selectively suspends the 0D PNCs while maintaining the underlying structure of the film. Notably, the long-chain ligands present on 0D nanocrystals prohibited using them as the sole emitters in PeLECs. Afterwards, the film was annealed in vacuum and at 150° C. to set the crystal structure of the film.

FIG. 1(c) shows the steady state absorption (inset) and emission spectra of the individual 3D, 0D PNCs (70% PLQY), and the 3D-0D PNCs composite films. While the absorption spectrum of the composite shows collective features of both 3D and 0D, the emission spectrum reveals an emission peak of similar full width at half maximum (FWHM) centered at 523 nm, which is slightly blue-shifted compared to 3D (~525 nm) and 0D (~524 nm) components. However, the PL lifetime (FIG. 1(d)) of the composite emission is significantly elongated compared to either 3D/0D, implying reduction of fast carrier trapping channels.

Figures 2A, 2B, 2C, 2D, 2E, 2F:
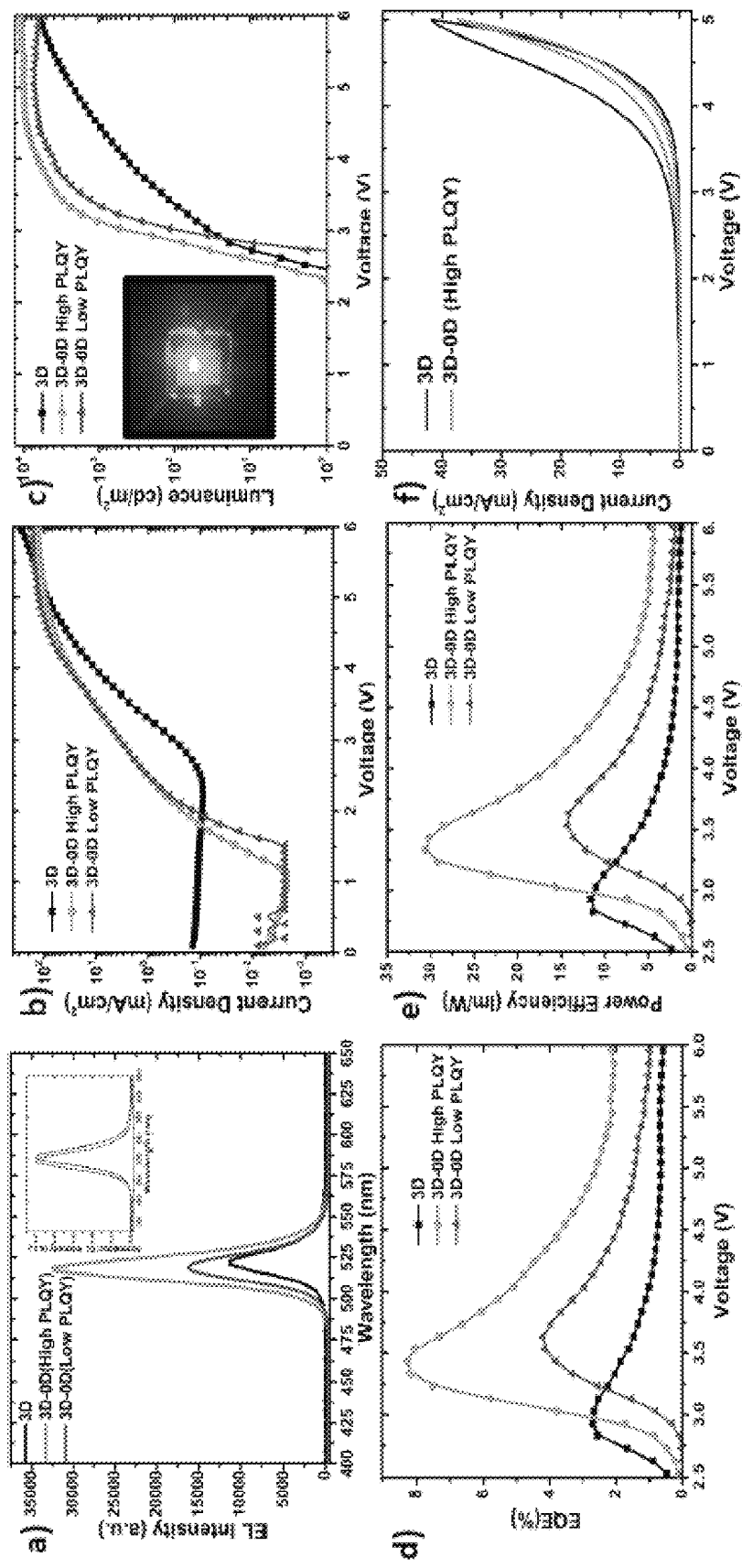
FIG. 2(a) shows a plot of electroluminescence (EL) versus wavelength (in nm) for 3D, 3D-0D (high photoluminescence quantum yield (PLQY)), and 3D-0D (low PLQY) PeLECs at 4.5 Volts (V), according to an embodiment of the subject invention. The curves with the lowest, second-lowest, and highest EL values at 525 nm are for 3D, 3D-0D (low PQLY), and 3D-0D (high PQLY), respectively.
FIG. 2(b) shows a plot of current density (in milliamps per square centimeter ($mA/cm^2$)) versus voltage (in V) for 3D, 3D-0D (high PLQY), and 3D-0D (low PLQY) PeLECs, according to an embodiment of the subject invention. The curves with the lowest, second-lowest, and highest current density values at 1.5 V are for 3D-0D (low PQLY), 3D-0D (high PQLY), and 3D, respectively.
FIG. 2(c) shows a plot of luminance (in candelas per square meter ($cd/m^2$)) versus voltage (in V) for 3D, 3D-0D (high PLQY), and 3D-0D (low PLQY) PeLECs, according to an embodiment of the subject invention. The curves with the lowest, second-lowest, and highest luminance values at 4 V are for 3D, 3D-0D (low PQLY), and 3D-0D (high PQLY), respectively.
FIG. 2(d) shows a plot of external quantum efficiency (EQE, in percentage (%)) versus voltage (in V) for 3D, 3D-0D (high PLQY), and 3D-0D (low PLQY) PeLECs, according to an embodiment of the subject invention. The curves with the lowest, second-lowest, and highest EQE values at 4 V are for 3D, 3D-0D (low PQLY), and 3D-0D (high PQLY), respectively.
FIG. 2(e) shows a plot of power efficiency (in lumens per Watt (Lm/W)) versus voltage (in V) for 3D, 3D-0D (high PLQY), and 3D-0D (low PLQY) PeLECs, according to an embodiment of the subject invention. The curves with the lowest, second-lowest, and highest power efficiency values at 4 V are for 3D, 3D-0D (low PQLY), and 3D-0D (high PQLY), respectively.
FIG. 2(f) shows a plot of current density (in $mA/cm^2$) versus voltage (in V) showing voltage sweeps for 3D and 3D-0D (high PLQY) PeLECs, according to an embodiment of the subject invention. The curves with the lowest and highest current density values at 4 V are for 3D, and the curves with the second-lowest and second-highest current density values at 4V are for 3D-0D (high PQLY).

Because the 3D-0D PNCs blend showed clear improvement of the PL properties over the 3D counterpart, their electroluminescence performance as the active material in PeLECs was compared with an ITO/PEDOT-PSS/perovskite:PEO:$LiPF_6$/LiF/Al architecture. In order to further investigate how the intrinsic PL qualities of 0D PNCs affect the overall emission from the composite device, 0D PNCs of both high (~70%) and low (~30%) PLQY were employed, synthesized by varying the Br ratio (see also, Yin et al., J. Phys. Chem. Lett. 2018, 9, 5490-5495; which is hereby incorporated by reference herein in its entirety). FIGS. 2(a)-2(f) show electroluminescence spectra and luminance-current-voltage characteristics of 3D and 3D-0D PeLECs. FIG. 2a shows the electroluminescence (EL) spectra of 3D and 3D-0D PNCs PeLECs (with high and low QY 0D PNCs). The 3D films exhibit a narrow EL emission peak centered at 522 nm, characteristic of $CsPbBr_3$ PeLECs, whereas both 3D-0D PNCs composites exhibited slightly blue-shifted emission centered at 518 nm, similar to the blueshift observed in the PL. EL spectra featuring similar characteristics as PL indicate minimal impact of the fabrication process on the integrity of the perovskite thin film. However, the EL intensity of the composites are significantly higher compared to that of the 3D-only device, with the high PLQY composite leading to an approximately 3-fold enhancement of the maximum.

The current density of the 3D, 3D-0D (high PLQY), and 3D-0D (low PLQY) PeLECs from current/voltage sweeping from 0 Volts (V) to 6V are presented in FIG. 2(b). The redistribution of ions largely dictates current injection in single layer LECs, and the thin film quality governs background/leakage current. The 3D device exhibits significant leakage current (~0.1 $mA/cm^2$) at low voltages and an onset of significant current injection above this threshold near 2.8 V. Addition of the 0D PNCs significantly lowers the leakage current density well below 0.01 $mA/cm^2$. The 3D-0D device can have a leakage current of, for example, any of the following values, about any of the following values, at most any of the following values, at least any of the following values, or in a range having any of the following values as endpoints (all values are in $mA/cm^2$): 0.09, 0.08, 0.07, 0.06, 0.05, 0.04, 0.03, 0.02, 0.01, 0.009, 0.008, 0.007, 0.006, 0.005, 0.004, 0.003, or 0.002. For example, the 3D-0D device can have a leakage current of not greater than 0.09 $mA/cm^2$, or the 3D-0D device can have a leakage current of not greater than 0.002 $mA/cm^2$. Further, the onset of current injection above this threshold is lowered to 1.6 V for the 3D-0D (low PLQY) PeLEC and 1.3 V for the 3D-0D (high PLQY). This lowered voltage threshold suggests that the 0D PNCs help facilitate ionic transport, potentially through the passivation of carrier trapping channels from the 3D perovskite lattice.

FIG. 2(c) shows the luminance of the PeLECs from current/voltage sweeping from 0 V to 6V. The onset of luminance above 1 $cd/m^2$, characteristic of the injection of the minority carrier, is observed between 2.3 V-2.7 V for these devices, with the 3D-0D (high PLQY) sample possessing the lowest onset voltage threshold. Likewise, the voltage to surpass 100 $cd/m^2$ luminance lowers from 3.4 V for the 3D-only PeLEC to 2.9 V for the 3D-0D (high PLQY) device. Over this 6 V range, the 3D device peaks at a luminance of 6050 $cd/m^2$, the 3D-0D (low PLQY) PeLEC at 7300 $cd/m^2$, and the 3D-0D (high PLQY) at 11200 $cd/m^2$. Thus, incorporating either low or high PLQY 0D PNCs into a 3D film leads to higher peak luminance, but while the low PLQY 0D insertion improves this metric by only about 20%, the high PLQY 0D PNCs raise the luminance by 85%. This differential enhancement unequivocally indicates that the intrinsic emission quality of 0D PNCs is the prime factor enhancing the luminance of the composite PeLECs.

In order to further understand how 0D PNCs impact PeLEC performance, the efficiency metrics from these devices are shown in FIGS. 2(d) and 2(e). The external quantum efficiency (EQE) of the 3D-only PeLEC peaks at 2.7% photons/electron, as seen in FIG. 2(d). The addition of the low PLQY 0D PNCs raises this peak EQE to 4.2%, while the high PLQY device maximizes at 8.3%, among the best values for any single-layer LEC.

The 3D-0D PeLEC can exhibit a maximum EQE of, for example, any of the following values, about any of the following values, at most any of the following values, at least any of the following values, or in a range having any of the following values as endpoints (all values are in %): 3.0, 3.1, 3.2, 3.3, 3.4, 3.5, 3.6, 3.7, 3.8, 3.9, 4.0, 4.5, 5.0, 6.0, 7.0, 8.0, 9.0, or 10.0. For example, the 3D-0D PeLEC can exhibit a maximum EQE of at least 3.0%, or at least 4.0%.

Similarly, the power efficiency maximum improves from 11.6 Lm/W for the 3D-only PeLEC to 14.3 Lm/W for the 3D-0D (low PLQY) PeLEC, to 33.0 Lm/W for the 3D-0D (high PLQY) PeLEC. Again, this 33.0 Lm/W measure is among the best for single-layer LECs. Moreover, these efficiency metrics are achieved at 3070 cd/m$^2$ for the 3D-0D (high PLQY) PeLEC.

The 3D-0D PeLEC can exhibit a maximum power efficiency of, for example, any of the following values, about any of the following values, at most any of the following values, at least any of the following values, or in a range having any of the following values as endpoints (all values are in Lm/W): 11.8, 12.0, 12.5, 13.0, 13.5, 14.0, 15.0, 16.0, 18.0, 20.0, 22.0, 24.0, 25.0, 26.0, 28.0, 30.0, 32.0, 33.0, or 35.0. For example, the 3D-0D PeLEC can exhibit a maximum power efficiency of at least 11.8 Lm/W, or at least 32.0 Lm/W.

Remarkably, the inclusion of 0D PNCs into a 3D perovskite matrix greatly enhances quantum and power efficiency metrics, with the 3D-0D (high PLQY) PeLEC rivaling the best performance in the field for single layer LECs. Further, while the low PLQY 0D PNCs improve the efficiency over 3D-only devices by about 25%-55%, introducing the high PLQY 0D PNCs into the film doubles and triples the EQE and power efficiency, respectively. Again, this strongly implies that the efficiency of the 0D PNC emissive state greatly enhances the efficiency of 3D-0D blended PeLECs.

In addition, blending the 0D PNCs into the 3D matrix reduces the hysteresis associated with cyclic PeLEC operation. Hysteresis in LECs occurs from slow ion relaxation. FIG. 2(f) shows the plot from cyclic current-voltage sweeping of 3D and 3D-0D high PLQY PeLECs. The hysteresis in current is greatly reduced, indicating more efficient ion transport with the inclusion of the 0D PNCs In order to assess the impact of PNCs on the stability of the PeLECs, the devices were operated at constant current, with the data presented in FIGS. 3(a) and 3(b). One general metric is the luminance half-life, the time to decay from the maximum to half maximum. Under 33.3 mA/cm$^2$ operation, the 3D PeLEC achieves a 3120 cd/m$^2$ luminance maximum and exhibits a luminance half-life of 26.0 hr. Likewise, under 33.3 mA/cm$^2$ operation, the 3D-0D (high PLQY) PeLEC achieves a 3640 cd/m$^2$ luminance maximum and exhibits a luminance half-life of 46.2 hr, highly competitive among PeLEC devices (see also FIG. 14, where "our work" in the last row is for an embodiment of the subject invention and the previous rows are all for related art devices).

The 3D-0D PeLEC can achieve a maximum luminance under 33.3 mA/cm$^2$ of, for example, any of the following values, about any of the following values, at most any of the following values, at least any of the following values, or in a range having any of the following values as endpoints (all values are in cd/m$^2$): 3200, 3250, 3300, 3350, 3400, 3450, 3500, 3550, or 3600. For example, the 3D-0D PeLEC can achieve a maximum luminance under 33.3 mA/cm$^2$ of at least 3200 cd/m$^2$, or at least 3600 cd/m$^2$.

The 3D-0D PeLEC can exhibit a luminance half-life under 33.3 mA/cm$^2$ of, for example, any of the following values, about any of the following values, at most any of the following values, at least any of the following values, or in a range having any of the following values as endpoints (all values are in hr): 27, 28, 29, 30, 31, 32, 33, 34, 35, 36, 37, 38, 39, 40, 41, 42, 43, 44, 45, 46, 47, 48, 49, or 50. For example, the 3D-0D PeLEC can exhibit a luminance half-life under 33.3 mA/cm$^2$ of at least 27 hr, or at least 46 hr.

As lifetimes of PeLECs generally scale inversely with luminance as a power law, the 3D-0D (high PLQY) PeLEC was also run at a constant current density of 10 mA/cm$^2$ to observe longer lifetimes. The PeLEC peaked at a luminance maximum of 1530 cd/m$^2$ and yielded a half-life of 129 hr, among the best for perovskite light-emitting devices (see also FIG. 14). This lifetime enhancement is likely owed to the noteworthy passivation of the 3D perovskite matrix by stable and emissive 0D PNCs and the preservation of the perovskite lattice by differentiated ion motion in the PeLEC, selective redistribution of the LiPF$_6$ additive ions.

Figures 3A, 3B, 3C, 3D:
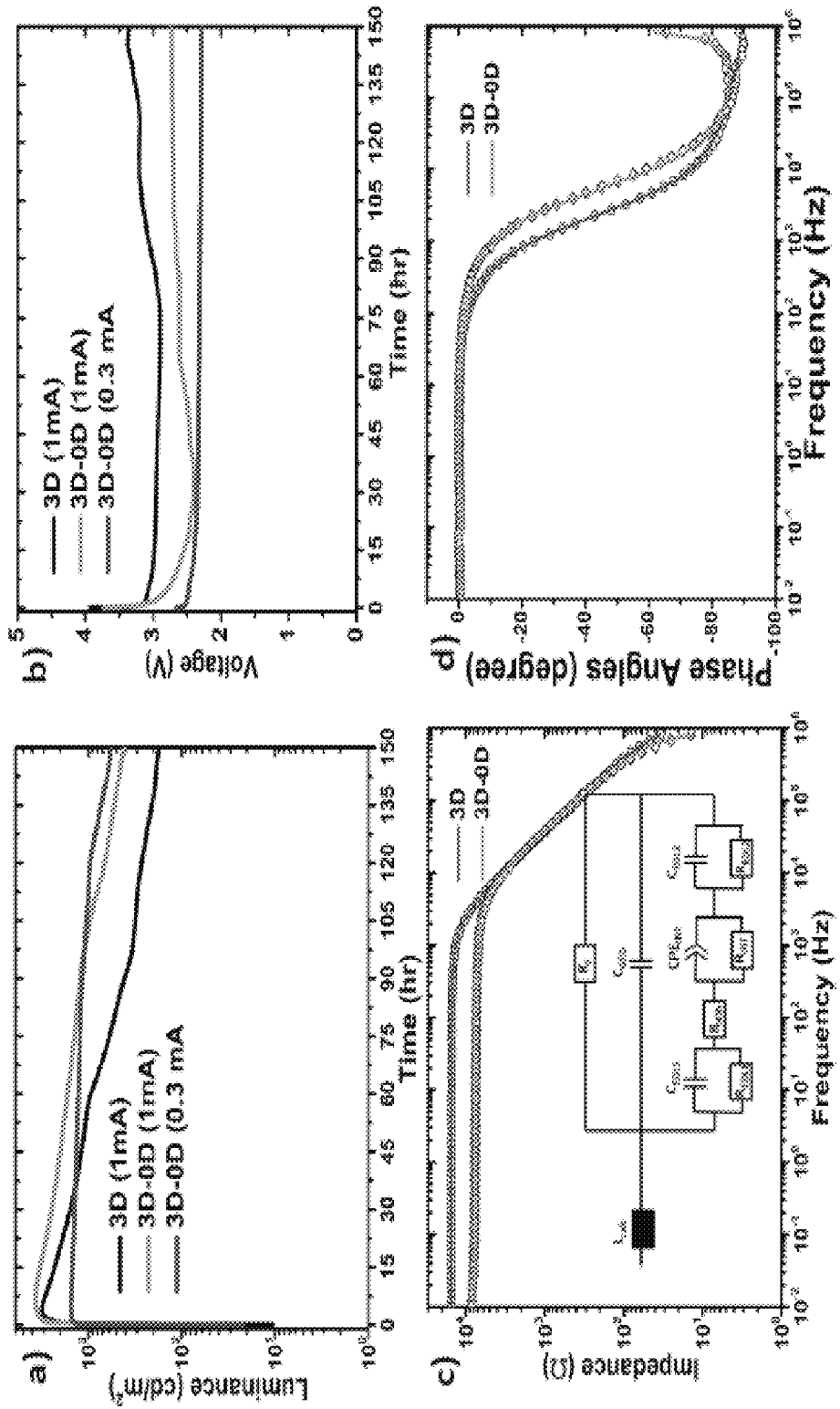
FIG. 3(a) shows a plot of luminance (in $cd/m^2$) versus time (in hours (hr)) for 3D and 3D-0D PeLECs at 33.3 $mA/cm^2$ and a 3D-0D PeLEC at 10 $mA/cm^2$ constant current, according to an embodiment of the subject invention. The curves with the lowest, second-lowest, and highest luminance values at 135 hr are for 3D, 3D-0D (1 mA), and 3D-0D (0.3 mA), respectively.
FIG. 3(b) shows a plot of voltage (in V) versus time (in hr) for 3D and 3D-0D PeLECs at 33.3 $mA/cm^2$ and a 3D-0D PeLEC at 10 $mA/cm^2$ constant current, according to an embodiment of the subject invention. The curves with the lowest, second-lowest, and highest voltage values at 135 hr are for 3D-0D (0.3 mA), 3D-0D (1 mA), and 3D, respectively.
FIG. 3(c) shows a plot of complex impedance magnitude (in Ohms (a)) versus frequency (in Hertz (Hz)) for 3D and 3D-0D PeLECs, according to an embodiment of the subject invention. Solid lines are equivalent circuit fits to the data, and the inset is an equivalent circuit model. The curves with the lowest and highest impedance values at 10 Hz are for 3D-0D and 3D, respectively.
FIG. 3(d) shows a plot of complex impedance phase angle (in degrees) versus frequency (in Hz) for 3D and 3D-0D PeLECs, according to an embodiment of the subject invention. Solid lines are equivalent circuit fits to the data. The curves with the lowest and highest phase angle values at 1000 Hz are for 3D and 3D-0D, respectively.

In FIG. 3(b), the operational voltage for each device under constant current is plotted. Constant current generally induces a higher voltage in the initial stages of operation while the device is resistive, encouraging facile ionic redistribution. On longer timescales, the voltage lowers as ion accumulation at the electrodes increases charge injection and lowers device resistance. For the 3D PeLEC at 33.3 mA/cm$^2$ constant current, after beginning near 4 V, the steady-state voltage ranges from 3.0 V to 3.4 V. The 3D-0D PeLEC at 33.3 mA/cm$^2$ also initiates near 4V, but the voltage quickly lowers to operate at a low 2.5 V-2.7 V.

The 3D-0D PeLEC can have a steady state voltage of, for example, any of the following values, about any of the following values, at most any of the following values, at least any of the following values, or in a range having any of the following values as endpoints (all values are in V): 4.0, 3.3, 3.2, 3.1, 3.0, 2.9, 2.8, 2.7, 2.6, 2.5, 2.4, 2.3, 2.2, 2.1, or 2.0. For example, the 3D-0D PeLEC can have a steady state voltage of not greater than 3.3 V, or not greater than 2.6 V.

This suggests that the 0D PNCs improve the conductivity of the overall device, and, given the observations from I-V testing, this improvement may originate from more facile ionic redistribution enhancing injection and carrier density. At 10.0 mA/cm$^2$, the 3D-0D PeLEC achieves an even lower steady-state voltage of 2.3 V, approaching the bandgap of these perovskites.

The mounting evidence of improved ionic redistribution and electronic conductivity from 0D nanoparticle inclusion led us to an investigation of the phenomenon by electrochemical impedance spectroscopy and fitting with an equivalent circuit model. FIGS. 3(a)-3(d) show constant current density and electrochemical impedance characteristics of 3D and 3D-0D PeLECs. The complex impedance for 3D and 3D-0D PeLECs is plotted as the magnitude and phase angle versus frequency in FIGS. 3(c) and 3(d), respectively. The equivalent circuit model used to fit the curve is shown as the inset in FIG. 3(c), a model that has previously fitted PeLEC operation. At low frequencies (>1 kilohertz (kHz)), the 3D-0D PeLEC exhibits a lower impedance than the 3D counterpart (FIG. 3(c)). The corner frequency increases from 2 kHz for the 3D PeLEC to 10 kHz for the 3D-0D PeLEC, a substantial improvement consistent with a greater ionic (capacitive) response. Similarly, the trend toward higher phase angles and more complex behavior is shifted to higher frequencies for the 3D-0D blend in FIG. 3(d).

Figures 11A, 11B, 12:
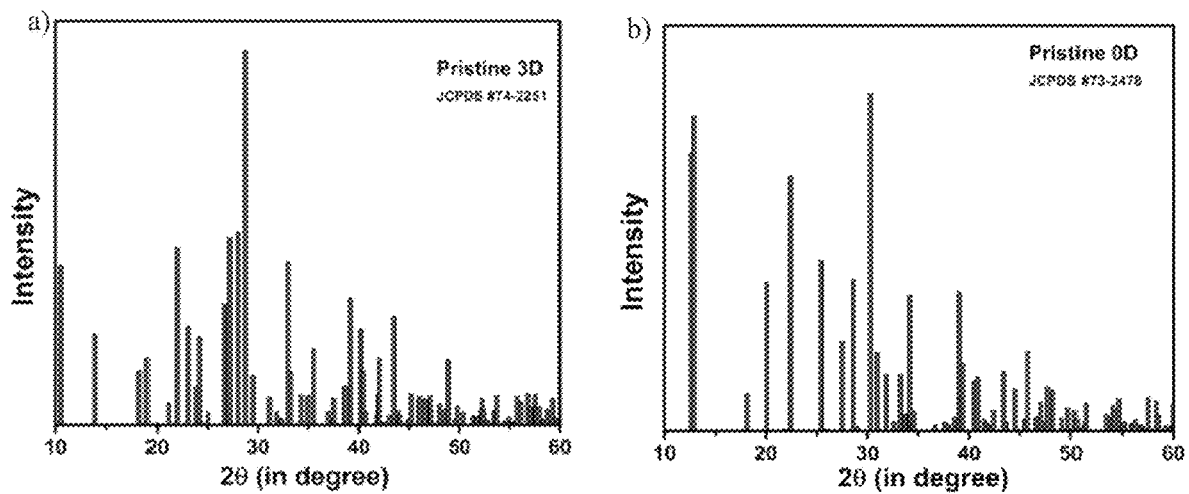
FIG. 11(a) shows an XRD spectrum for a 3D $CsPbBr_3$ perovskite film.
FIG. 11(b) shows an XRD spectrum for a 0D $Cs_4PbBr_6$ perovskite film.
FIG. 12 shows a table of alternating current (AC) impedance data, according to an embodiment of the subject invention.

The equivalent circuit model provides an excellent fit to the impedance curves (solid lines of FIGS. 3(c) and 3(d)), and the parameters extracted from this fitting are shown in the table in FIG. 12. In short, this equivalent circuit accounts for an overall resistance, an overall geometric capacitance, double layer formation at each contact with a resistor and capacitor in parallel, and internal ionic effects. In a particular embodiment, the conductivity of the 3D-0D device is 75% higher than the 3D-only PeLEC analog. In other embodiments, the conductivity of the 3D-0D device can be, for example, any of the following values, about any of the following values, at most any of the following values, at least any of the following values, or in a range having any of the following values as endpoints (all values are in microSiemens per meter (µS/m)): 90, 100, 110, 120, 130, or 140. For example, the conductivity of the 3D-0D device can be at least 90 µS/m, or at least 140 µS/m. In a particular embodiment, the dielectric constant is reduced from 15.3 for the 3D PeLEC to 10.8 for the 3D-0D blend, beneficial for enhanced luminance as Langevin recombination is inversely proportional to the dielectric constant. In other embodiments, the dielectric constant of the 3D-0D device can be not greater than 15.0, such as not greater than 14.0, not greater than 13.0, not greater than 12.0, or not greater than 11.0. Concerning double layer formation, the capacitance increases with the 3D-0D blend, and the widths are decreased by about 40% relative to the 3D device to 3.0 nm and 3.3 nm. The thinner widths are ideal for a narrower tunnel barrier for charge injection at each contact, and the symmetric barrier widths assist balanced injection for high recombination efficiency. In an embodiment, the 3D-0D PeLEC having a double layer formation, wherein each of the layers can have a width of not greater than 4.9 nm, such as not greater than 4.5 nm, not greater than 4.0 nm, or not greater than 3.5 nm. The geometric capacitance decreases for the 3D-0D device, consistent with a greater participation of ions in double-layer formation. The 3D-0D PeLEC can have a geometric capacitance of, for example, any of the following values, about any of the following values, at most any of the following values, at least any of the following values, or in a range having any of the following values as endpoints (all values are in nanoFarads (nF)): 3.20, 3.10, 3.00, 2.90, 2.80, 2.70, 2.60, 2.50, or 2.40. For example, the 3D-0D PeLEC can have a geometric capacitance of not greater than 3.20 nF, or not greater than 2.40 nF. Hence, electrochemical impedance spectroscopy affirms the beneficial effects of 0D PNC incorporation in the 3D matrix on electrical and ionic transport in PeLECs and additional factors that improve emission efficiency.

Figure 4:
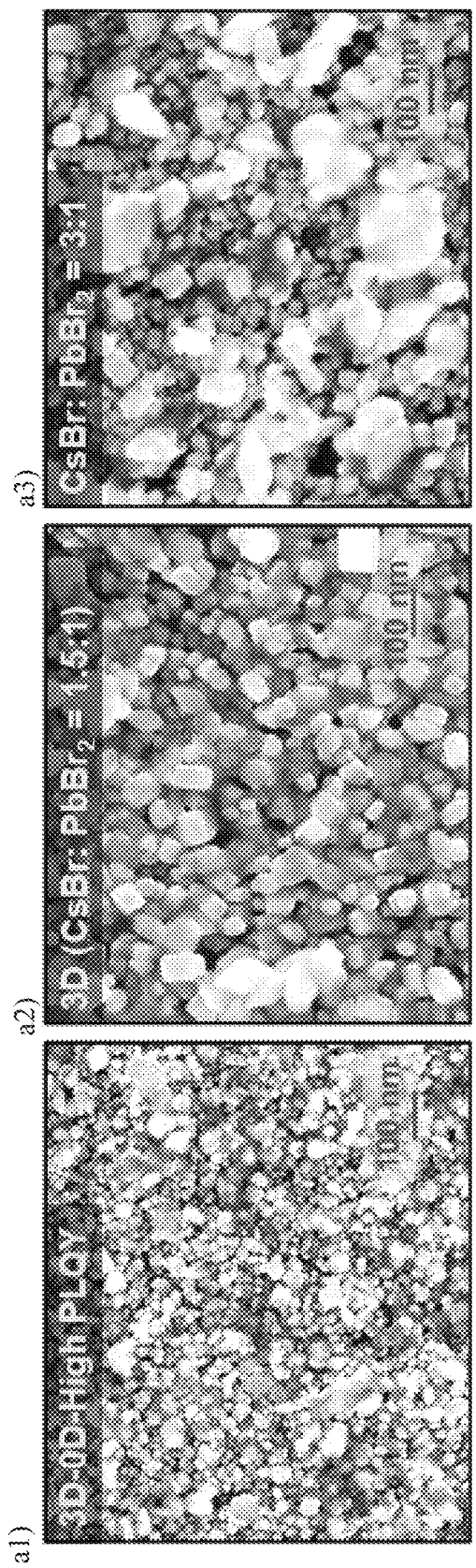
FIGS. 4(a1)-4(a3) show scanning electron microscopy (SEM) images of thin films of 4(a1) 3D-0D (high PLQY) perovskites, 4(a2) a 3D-only ($CsBr:PbBr_2$=1.5:1) film, and 4(a3) a film cast from a different precursor ratio ($CsBr:PbBr_2$=3:1) to spontaneously produce 0D phases in the 3D matrix, according to embodiments of the subject invention.
Figure 4:
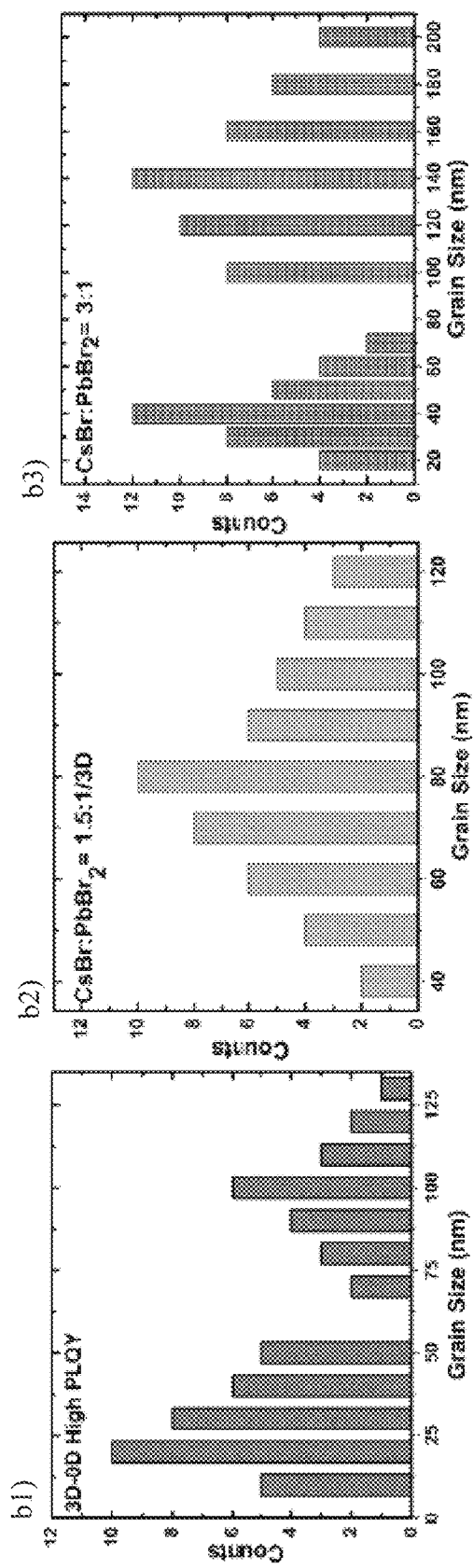
Figure 4C:
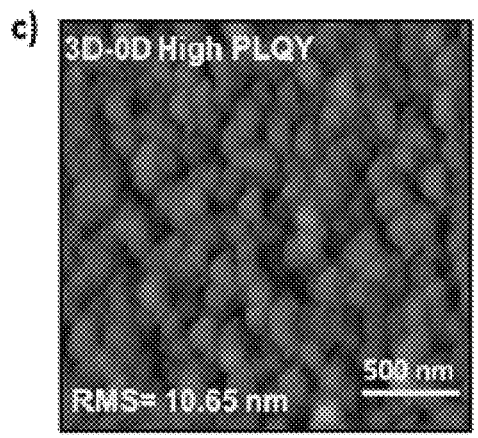
FIG. 4(c) shows an atomic force microscopy (AFM) image of a thin film of 3D-0D (high PLQY) perovskites, according to an embodiment of the subject invention.

It is important to physically characterize the thin film properties to ascertain if morphological effects also contribute to the superior performance of the 3D-0D blends and verify the presence of each component. Increasing the CsBr ratio may lead to more 0D phase formation, which in turn can reduce the crystallite/grain size of the 3D part leading to increased confinement. In order to compare the 3D-0D PNC blend with those from the related art (see Bao et al., J. Phys. Chem. Lett. 2020, 11, 10196-10202; Cao et al., J. Phys. Chem. C 2021, 125, 3-19; and Liu et al., ACS Appl. Nano Mater. 2021, 4, 1162-1174; all three of which are hereby incorporated herein by reference in their entireties) composite films were prepared with an excess of CsBr (CsBr:$PbBr_2$=2:1 and CsBr:$PbBr_2$=3:1) and analyzed the structural details and device performance relative to the 3D and 3D-0D PNCs composite. As can be seen from the scanning electron microscopy (SEM) images provided in FIGS. 4(a1)-4(a3), the introduction of 0D PNCs reduces the grain size significantly compared to the 3D film (CsBr:$PbBr_2$=1.5:1). In addition, both the 3D-0D film and the 3:1 precursor film showed a bimodal size distribution, while the 3D film was monomodal (see FIGS. 4(b1)-4(b3)). However, the films appeared smoothest and having the fewest pinholes for the 3D-0D film. This assertion can be further confirmed from the atomic force microcopy (AFM) image provided in FIG. 4(c). The incorporation of 0D PNCs can reduce the surface roughness of a 3D-0D film compared to a 3D film (CsBr:$PbBr_2$=1.5:1).

The 3D-0D film can have a surface roughness (root mean squared (RMS)) of, for example, any of the following values, about any of the following values, at most any of the following values, at least any of the following values, or in a range having any of the following values as endpoints (all values are in nm): 25, 24, 23, 22, 21, 20, 19, 18, 17, 16, 15, 14, 13, 12, 11, or 10. For example, the 3D-0D film can have a surface roughness (RMS) of not greater than 23 nm, or not greater than 11 nm.

Figure 4D:
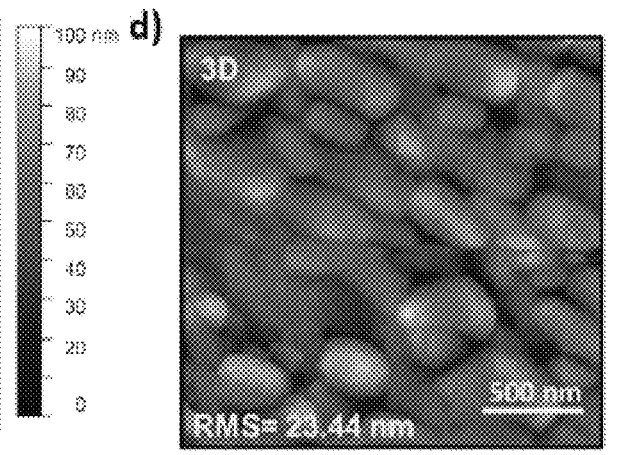
FIG. 4(d) shows an AFM image of a thin 3D perovskite film, according to an embodiment of the subject invention.

In a particular embodiment, the incorporation of 0D PNCs reduces the surface roughness of the 3D-0D film more than twofold, from 23.44 nm to 10.65 nm, compared to 3D film (see FIG. 4(d)). Additionally, the 0D PNCs-3D film shows tighter packing and evidence of fewer pinholes. These features are all beneficial for suppressed leakage current leading to higher quantum efficiencies and greater device reliability. However, because the composites involving high QY and low QY 0D PNCs show almost similar morphology (see FIGS. 9(a)-9(f) and 10(a)-10(f)), and yet a significant difference in the performance of the corresponding PeLECs, the emission QY of the 0D PNCs indeed plays a crucial role along with the change in morphology. Unlike other films where the thin film morphology is mostly dominated by larger 0D grains that encapsulate/act as a matrix for smaller 3D grains, in embodiments of the subject invention, only about 7 wt % addition of 0D PNCs compared to 3D implies that the grains observed in the SEM images are still originated primarily from the 3D part.

Figure 4E:
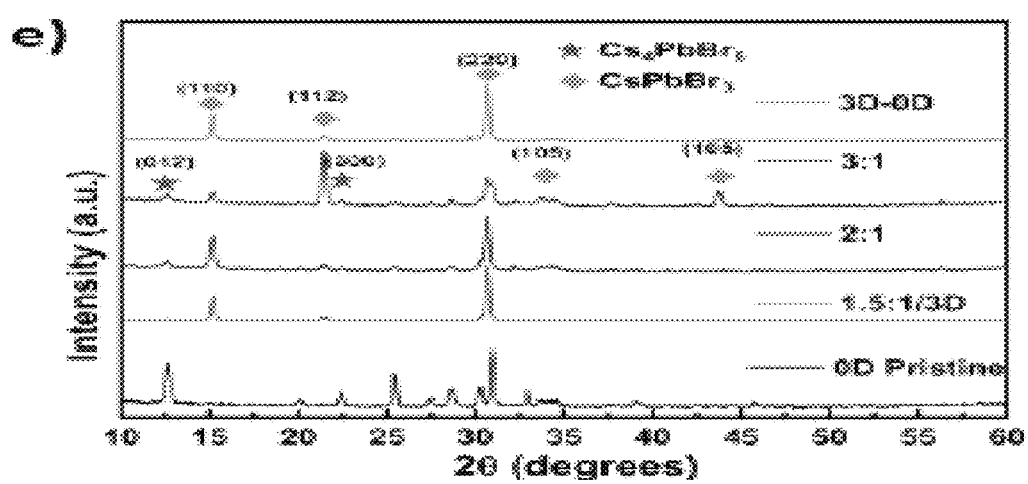
FIG. 4(e) shows a plot of X-ray diffraction (XRD) spectra for thin films of 0D perovskite nanocrystals (PNCs) and different composite 3D-0D perovskite films, according to embodiments of the subject invention.

In order to further confirm the ratios between 0D and 3D components, the X-ray diffraction patterns (XRD) of the same samples were analyzed, along with the films prepared by varying CsBr and $PbBr_2$ ratios. As shown in FIG. 4(e), the 3D film (CsBr:$PbBr_2$=1.5:1) showed major diffraction peaks at 15.3°, 21.5°, and 30.7°, in agreement with reports for an orthorhombic (Pnma) crystal structure (see also FIGS. 11(a) and 11(b) for reference XRD spectra). With an increase in the CsBr:$PbBr_2$ ratio, the XRD shows an appearance and consecutive increase of characteristic 0D $Cs_4PbBr_6$ peaks at 12.7° and 22.4° (marked with the stars). The most intense 0D peaks were observed for CsBr:$PbBr_2$ ratio of 3:1, indicating an increased amount of 0D component in the composite. However, for the 3D-0D PNCs blend, the ratio of 0D peaks relative to 3D remains negligible, which complies with the presence of a low weight percentage of 0D PNCs relative to 3D.

Figures 5A, 5B:
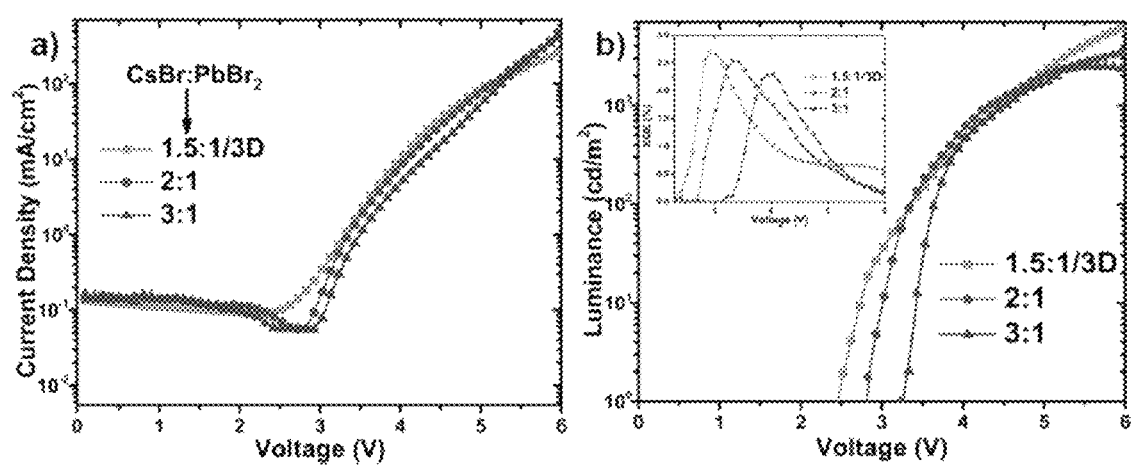
FIG. 5(a) shows a plot of current density (in $mA/cm^2$) versus voltage (V) for PeLECs formed from different $CsBr:PbBr_2$ precursor ratios, according to embodiments of the subject invention. The curves with the lowest, second-lowest, and highest current density values at 3 V are for 3:1 ($CsBr:PbBr_2$), 2:1, and 1.5:1/3D, respectively.
FIG. 5(b) shows a plot of luminance (in $cd/m^2$) versus voltage (in V) for PeLECs formed from different $CsBr:PbBr_2$ precursor ratios, according to embodiments of the subject invention. The curves with the lowest, second-lowest, and highest luminance values at 6 V are for 3:1 ($CsBr:PbBr_2$), 2:1, and 1.5:1/3D, respectively. The inset shows a plot of EQE versus voltage for PeLECs formed from different $CsBr:PbBr_2$ precursor ratios, according to embodiments of the subject invention; the curves with the lowest, second-lowest, and highest EQE values at 4 V are for 1.5:1 ($CsBr:PbBr_2$)/3D, 2:1, and 3:1, respectively.
Figure 6:
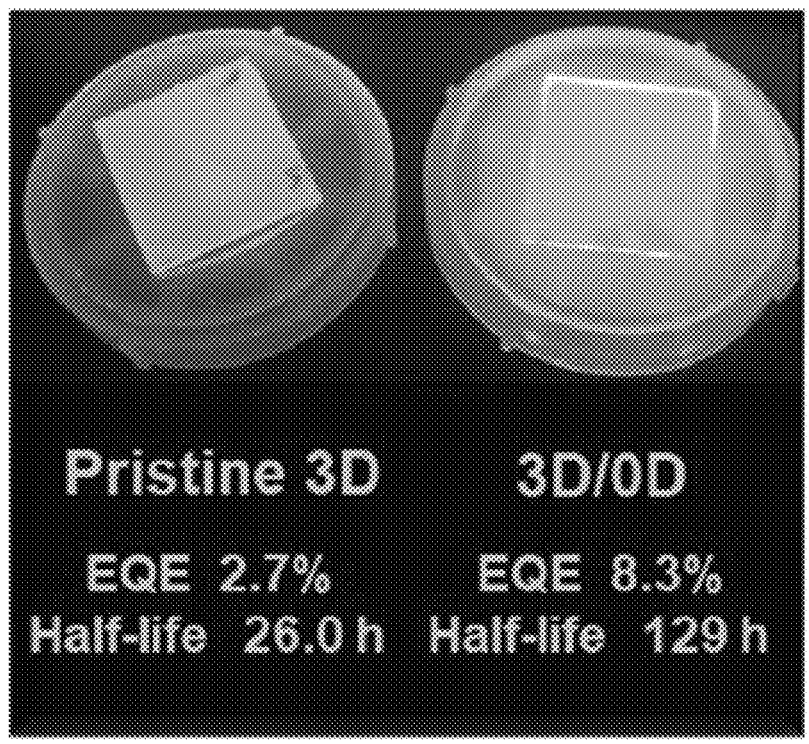
FIG. 6 shows an image showing a pristine 3D perovskite sample (left) and a 3D/0D sample (right), according to an embodiment of the subject invention.
Figure 7:
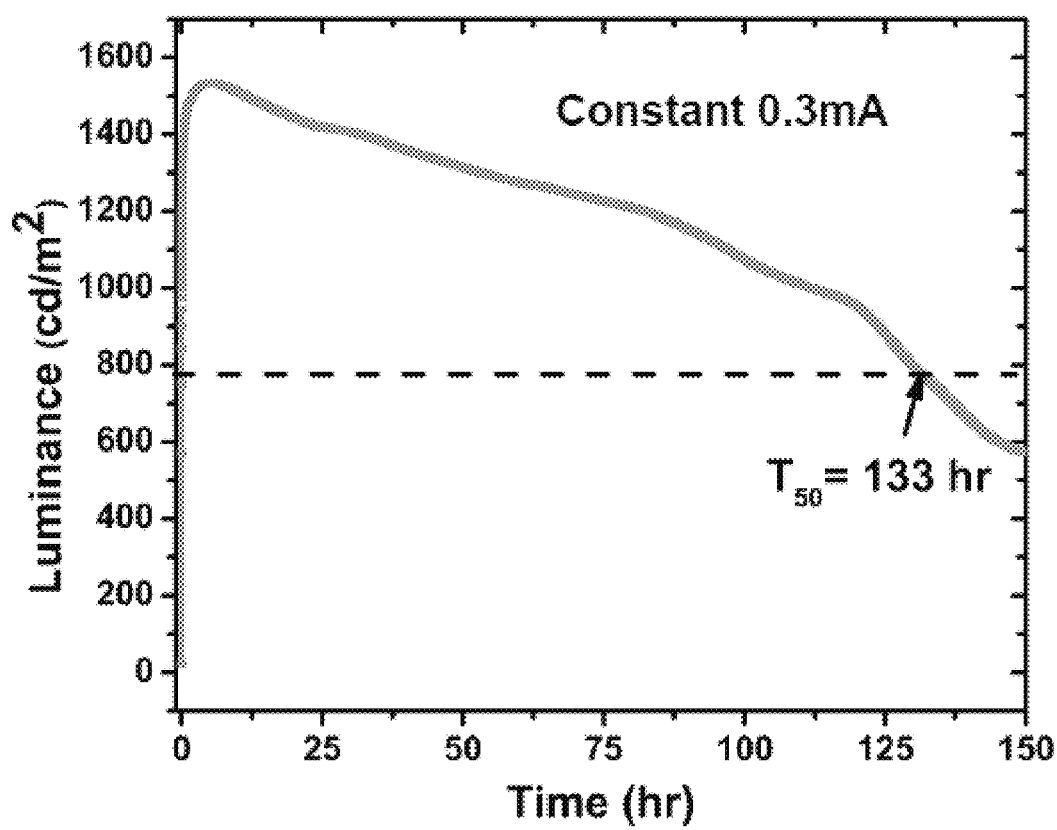
FIG. 7 shows a plot of luminance (in $cd/m^2$) versus time (in hr) illustrating extended lifetime data of luminance of an embodiment of the subject invention.

In order to clarify how incorporating highly emissive 0D PNCs impacts device operation compared to non-emissive $Cs_4PbBr_6$ formed from a high $CsBr:PbBr_2$ ratio, the performance of corresponding 3D-0D PeLECs were analyzed. FIGS. 5(a) and 5(b) are illustrate luminance-current-voltage (L-I-V) characteristics of PeLECs formed from different $CsBr:PbBr_2$ precursor ratios, and in particular compare the L-I-V PeLEC performance of the 3D only film ($CsBr:PbBr_2$ 1.5:1) with devices prepared from $CsBr:PbBr_2$ precursor formulations of 2:1 and 3:1 having a significant 0D phase as observed in XRD. The inset of FIG. 5(b) shows EQE versus voltage for PeLECs formed from different $CsBr:PbBr_2$ precursor ratios. These spontaneous 3D-0D films allow comparison of their performance to the 3D-0D devices from pre-synthesized 0D PNCs of low and high PLQY (see also FIGS. 2(a)-2(f)). From the current density versus voltage curve provided in FIG. 5(a), it is obvious that an increase in the amount of CsBr does not suppress the leakage current or improve the charge injection as observed for incorporating 0D PNCs. In the luminance versus voltage graph of FIG. 5(b), the turn-on voltage is increased for 2:1 and 3:1 precursor films, and the peak luminance is lowered relative to the 1.5:1 3D-only phase. The EQE vs. voltage plot (inset of FIG. 5(b)) shows that the EQE peak values fall from 2.7% for the 3D-only device to 2.5% for the 2:1 phase and 2.3% for the 3:1 phase. Thus, the spontaneous 0D phase formation from higher $CsBr:PbBr_2$ precursor formulations did not benefit device performance, likely due to their non-luminescent nature. This lowered performance highlights the contrasting improved light-emitting performance of 3D-0D composite originating from the pre-synthesized PNCs compared to the typical approach of the related art.

It is challenging to directly compare the device lifetimes at various luminance levels. Alternatively, the extrapolated half-lives (time to decay to half of the maximum luminance) at a common 100 $cd/m^2$ initial luminance can be calculated using the equation:

$$T_2 = T_1 \left(\frac{L_1}{L_2}\right)^{A_F} \quad (1)$$

where $T_2$ is the extrapolated half-life from an initial luminance of $L_2$=100 $cd/m^2$, $T_1$ is the experimentally measured half-life at the experimentally measured maximum luminance of $L_1$, and $A_F$ is a dimensionless exponential acceleration factor taken to be 1.5-1.7 from prior experimental observations. This metric has been shown to be valid for thin film devices, and has been used to assess perovskite devices. (see also Xu et al., Adv. Mater. 2017, 29, 1703703; which is hereby incorporated by reference herein in its entirety). In order to compare all devices as discussed above, the extrapolated luminance half-life was extracted using a modest $A_F$ of 1.5.

Embodiments of the subject invention provide active emissive layers comprising 0D PNCs incorporated into a 3D perovskite material matrix, as well as high performance electroluminescent devices utilizing such active emissive layers. The 0D PNCs can be, for example, $Cs_4PbBr_6$ PNCs, and/or the 3D perovskite material matrix can be, for example, a $CsPbBr_3$ matrix, though embodiments are not limited thereto. A novel solvent engineering method can be used to incorporate the 0D PNCs into the 3D perovskite matrix. The active emissive layers and PeLECs of embodiments of the subject invention provide dramatically improved maximum luminance (e.g., 11200 $cd/m^2$), power (33.0 Lm/W), and EQE (8.3%), as well as operational stability (129 hr at 10 $mA/cm^2$) of the electroluminescent device. This operational stability is among the best for perovskite electroluminescent devices. It also improves the film morphology by reducing grain size, surface roughness, and the number of pinholes, resulting in suppressed leakage current. Contrary to related art light-emitting devices where non-luminescent 0D particles act mostly as a surface passivating matrix to provide quantum/dielectric confinement, in embodiments of the subject invention the high intrinsic luminescence of the 0D PNCs plays a crucial role in significantly enhancing the luminance of our composites. This approach opens up numerous advantages of 0D $Cs_4PbBr_6$ PNCs for high-performance electroluminescent devices.

Though $Cs_4PbBr_6$ (e.g., $Cs_4PbBr_6$ PNCs) and $CsPbBr_3$ have been discussed extensively herein as the 0D perovskite material and the 3D perovskite material, respectively, this is for exemplary purposes only and should not be construed as limiting. Other perovskite materials can be used, such as other metal halide perovskites. For example, instead of cesium (Cs) and/or instead of lead (Pb), any of the following can be used for the monovalent and/or divalent ions of the perovskite: tin (Sn); germanium (Ge); antimony (Sb); bismuth (Bi); aluminum (Al); gallium (Ga); indium (In); thallium (Tl); copper (Cu); gold (Au); nickel (Ni); cobalt (Co); iron (Fe); manganese (Mn); chromium (Cr); vanadium (V); titanium (Ti); scandium (Sc); yttrium (Y); cerium (Ce); praseodymium (Pr); neodymium (Nd); samarium (Sm); europium (Eu); gadolinium (Gd); terbium (Tb); dysprosium (Dy); holmium (Ho); erbium (Er); thulium (Tm); ytterbium (Yb); lutetium (Lu); plutonium (Pu); americium (Am); or berkelium (Bk) (see also Li et al., Lead-Free Halide Perovskites for Light Emission: Recent Advances and Perspectives, Advanced Science, vol. 8, issue 4, 2003334, 2021, doi.org/10.1002/advs.202003334 (particularly FIG. 1 thereof); which is hereby incorporated by reference herein in its entirety).

A PeLEC is described in Bose et al. (Single-Particle Spectroscopy as a Versatile Tool to Explore Lower-Dimensional Structures of Inorganic Perovskites, ACS Energy Letters, published Sep. 27, 2021; which is hereby incorporated herein by reference in its entirety).

When the term "approximately" or "about" is used herein, in conjunction with a numerical value, it is understood that the value can be in a range of 95% of the value to 105% of the value, i.e. the value can be +/−5% of the stated value. For example, "about 1 kg" means from 0.95 kg to 1.05.

The subject invention includes, but is not limited to, the following exemplified embodiments.

Embodiment 1. An active emissive layer configured for use in a light-emitting electrochemical cell, the active emissive layer comprising:
 a three-dimensional (3D) perovskite material; and
 a luminescent zero-dimensional (0D) perovskite material embedded in the 3D perovskite material.

Embodiment 2. The active emissive layer according to embodiment 1, wherein the 0D perovskite material comprises perovskite nanocrystals (PNCs).

Embodiment 3. The active emissive layer according to any of embodiments 1-2, wherein the 0D perovskite material comprises cesium lead halide particles.

Embodiment 4. The active emissive layer according to any of embodiments 1-3, wherein the 0D perovskite material comprises $Cs_4PbBr_6$.

Embodiment 5. The active emissive layer according to any of embodiments 1-4, wherein the 3D perovskite material is a 3D perovskite material matrix.

Embodiment 6. The active emissive layer according to any of embodiments 1-5, wherein the 3D perovskite material comprises crystalline $CsPbX_3$ (where X=Cl, Br, or I).

Embodiment 7. The active emissive layer according to any of embodiments 1-6, wherein the 3D perovskite material comprises $CsPbBr_3$.

Embodiment 8. The active emissive layer according to any of embodiments 1-7, wherein the active emissive layer has a surface roughness (RMS) of not greater than 22 nanometers (nm).

Embodiment 9. The active emissive layer according to any of embodiments 2-8, wherein the PNCs are uniformly distributed in the 3D perovskite material.

Embodiment 10. The active emissive layer according to any of embodiments 1-9, wherein the active emissive layer is a single, monolithic layer.

Embodiment 11. A light-emitting electrochemical cell (LEC), comprising the active emissive layer according to any of embodiments 1-10.

Embodiment 12. The LEC according to embodiment 11, wherein the LEC is configured to provide a maximum external quantum efficiency (EQE) of at least 3.0%.

Embodiment 13. The LEC according to any of embodiments 11-12, wherein the LEC is configured to provide a maximum power efficiency of at least 11.8 Lm/W.

Embodiment 14. The LEC according to any of embodiments 11-13, wherein the LEC is configured to provide a maximum luminance of at least 3200 $cd/m^2$ under 33.3 $mA/cm^2$ operation.

Embodiment 15. The LEC according to any of embodiments 11-14, wherein the LEC is configured to provide a luminance half-life of at least 34.0 hours under 33.3 $mA/cm^2$ operation.

Embodiment 16. The LEC according to any of embodiments 11-15, wherein the LEC is configured to provide a steady state voltage of not greater than 2.9 V at a constant current density of 33.3 $mA/cm^2$.

Embodiment 17. The LEC according to any of embodiments 11-16, wherein the LEC is configured to provide a leakage current of not greater than 0.09 $mA/cm^2$.

Embodiment 18. The LEC according to any of embodiments 11-17, wherein the LEC is configured to provide a conductivity of at least 90 µS/m.

Embodiment 19. The LEC according to any of embodiments 11-18, wherein the LEC is configured to provide a dielectric constant of not greater than 15.0.

Embodiment 20. The LEC according to any of embodiments 11-19, wherein the LEC is configured to provide a geometric capacitance of not greater than 3.20 nF.

Embodiment 21. The LEC according to any of embodiments 11-20, further comprising an anode and a cathode (see also, e.g., FIG. 1(b)), wherein the active emissive layer is sandwiched between the anode and the cathode (e.g., with the active emissive layer in direct physical contact with the anode and/or the cathode, and/or the active emissive layer spaced apart from (e.g., by another component) the anode and/or the cathode).

Embodiment 22. A method of fabricating an active emissive layer configured for use in a light-emitting electrochemical cell (LEC), the method comprising:
  a) providing an intermediate three-dimensional (3D) thin film (i.e., thickness in a range of from a fraction of a nm to several micrometers (µm); for example, thickness of 0.1 nm to 1 µm) formed from a 3D perovskite precursor in a first solvent;
  b) modifying the intermediate 3D thin film to obtain a 3D-zero-dimensional (0D) (3D-0D) thin film by incorporating therein a pre-synthesized 0D perovskite nanocrystal (PNC) material dispersed in an orthogonal solvent; and
  c) annealing the 3D-0D thin film to obtain the active emissive layer configured for use in the LEC.

Embodiment 23. The method according to embodiment 22, wherein the first solvent is dimethyl sulfoxide (DMSO).

Embodiment 24. The method according to any of embodiments 22-23, wherein the orthogonal solvent is hydrofluoroether (HFE) orthogonal solvent.

Embodiment 25. The method according to any of embodiments 22-24, wherein the 3D perovskite precursor comprises $CsPbX_3$ (where X=Cl, Br, or I).

Embodiment 26. The method according to embodiment 25, wherein the $CsPbX_3$ is obtained from a mixture of $CsX:PbX_2$, at a first ratio.

Embodiment 27. The method according to embodiment 26, wherein the first ratio is 1.5:1 (or about 1.5:1).

Embodiment 28. The method according to embodiment 26, wherein the first ratio is 2:1 (or about 2:1).

Embodiment 29. The method according to embodiment 26, wherein the first ratio is 3:1 (or about 3:1).

Embodiment 30. The method according to any of embodiments 22-24, wherein the 3D perovskite precursor comprises $CsPbBr_3$.

Embodiment 31. The method according to embodiment 30, wherein the $CsPbBr_3$ is obtained from a mixture of $CsBr:PbBr_2$, at a first ratio.

Embodiment 32. The method according to embodiment 31, wherein the first ratio is 1.5:1 (or about 1.5:1).

Embodiment 33. The method according to embodiment 31, wherein the first ratio is 2:1 (or about 2:1).

Embodiment 34. The method according to embodiment 31, wherein the first ratio is 3:1 (or about 3:1).

Embodiment 35. The method according to any of embodiments 22-34, wherein the pre-synthesized 0D PNC material is luminescent before it is incorporated into the intermediate 3D thin film.

Embodiment 36. The method according to any of embodiments 22-35, wherein a normalized photoluminescence (PL) intensity of the pre-synthesized 0D PNC material is the same (or about the same (i.e., within 5%)) as a normalized PL intensity of a 3D material of the intermediate 3D thin film.

Embodiment 37. The method according to any of embodiments 22-36, wherein step b) comprises distributing 0D PNCs of the 0D perovskite nanocrystal (PNC) material dispersed in the orthogonal solvent into the intermediate 3D thin film (e.g., by rotating the intermediate 3D thin film (e.g., at 1500 rpm or about 1500 rpm) while the orthogonal solvent is provided thereto).

Embodiment 38. The method according to any of embodiments 22-37, wherein step c) comprises vacuum annealing (e.g., for a period of time such as 150 sec or about 150 sec) the 3D-0D thin film.

Embodiment 39. The method according to any of embodiments 22-38, wherein step c) comprises thermal annealing the 3D-0D thin film (e.g., at a temperature of 150° C. or about 150° C., and/or for a period of time such as 35 sec or about 35 sec).

Embodiment 40. The method according to any of embodiments 22-39, further comprising, after step c), sandwiching the active emissive layer between an anode and a cathode of the LEC.

Embodiment 41. The active emissive layer according to any of embodiments 1, 2, 5, or 8-10, the LEC according to any of embodiments 11-21, or the method according to any of embodiments 22-24 or 35-40, wherein the 3D perovskite material comprises $A^1A^2X_3$ (where X=Cl, Br, or I) (e.g., crystalline $CsAX_3$), where $A^1$ is any of the following: Cs; Pb; Sn; Ge; Sb; Bi; Al; Ga; In; Tl; Cu; Au; Ni; Co; Fe; Mn; Cr; V; Ti; Sc; Y; Ce; Pr; Nd; Sm; Eu; Gd; Tb; Dy; Ho; Er; Tm; Yb; Lu; Pu; Am; or Bk, and where $A^2$ is any of the following: Cs; Pb; Sn; Ge; Sb; Bi; Al; Ga; In; Tl; Cu; Au; Ni; Co; Fe; Mn; Cr; V; Ti; Sc; Y; Ce; Pr; Nd; Sm; Eu; Gd; Tb; Dy; Ho; Er; Tm; Yb; Lu; Pu; Am; or Bk, and/or wherein the 0D perovskite material comprises $A^1_4A^2X6$ (where X=Cl, Br, or I), where $A^1$ is any of the following: Cs; Pb; Sn; Ge; Sb; Bi; Al; Ga; In; Tl; Cu; Au; Ni; Co; Fe; Mn; Cr; V; Ti; Sc; Y; Ce; Pr; Nd; Sm; Eu; Gd; Tb; Dy; Ho; Er; Tm; Yb; Lu; Pu; Am; or Bk, and where $A^2$ is any of the following: Cs; Pb; Sn; Ge; Sb; Bi; Al; Ga; In; Tl; Cu; Au; Ni; Co; Fe; Mn; Cr; V; Ti; Sc; Y; Ce; Pr; Nd; Sm; Eu; Gd; Tb; Dy; Ho; Er; Tm; Yb; Lu; Pu; Am; or Bk.

Embodiment 42. The method according to any of embodiments 25-34, wherein instead of Pb, any of the following is present: Sn; Ge; Sb; Bi; Al; Ga; In; Tl; Cu; Au; Ni; Co; Fe; Mn; Cr; V; Ti; Sc; Y; Ce; Pr; Nd; Sm; Eu; Gd; Tb; Dy; Ho; Er; Tm; Yb; Lu; Pu; Am; or Bk, and/or wherein instead of Cs, any of the following is present: Sn; Ge; Sb; Bi; Al; Ga; In; Tl; Cu; Au; Ni; Co; Fe; Mn; Cr; V; Ti; Sc; Y; Ce; Pr; Nd; Sm; Eu; Gd; Tb; Dy; Ho; Er; Tm; Yb; Lu; Pu; Am; or Bk.

A greater understanding of the embodiments of the subject invention and of their many advantages may be had from the following examples, given by way of illustration. The following examples are illustrative of some of the methods, applications, embodiments, and variants of the present invention. They are, of course, not to be considered as limiting the invention. Numerous changes and modifications can be made with respect to the invention.

Materials and Methods

Materials: Cesium bromide (CsBr; 99.99%) and polyethylene oxide (PEO; molecular weight >5,000,000) were purchased from Alfa Aesar. Cesium carbonate ($Cs_2CO_3$, 99%), lead bromide ($PbBr_2$, >98%), oleic acid (OA, 90%), oleylamine (OLA, 90%), N,N-dimethylformamide (DMF, 99.8%), 1,2-dichlorobenzene (DCB, anhydrous, 99%), n-hexane (anhydrous, 99.98%), Lead (II) bromide ($PbBr_2$; 99.99% trace metal basis), Lithium hexafluorophosphate ($LiPF_6$; 99.99%), and dimethyl sulfoxide (DMSO; anhydrous >99.9%) were purchased from Sigma Aldrich. ITO-coated glass slides were purchased from Thin Film Devices, Inc. (Anaheim, CA). Aluminum (99.99%) was purchased from Kurt J. Lesker. LiF was purchased from Sigma Aldrich.

Synthesis of $Cs_4PbBr_6$ PNCs: $Cs_4PbBr_6$ PNCs were synthesized using reverse microemulsion method. In a typical procedure, the $PbBr_2$ precursor and the Cs-oleate precursor were synthesized separately. First, a mixture of 2.25 grams (g) of $Cs_2CO_3$ and 21.5 mL of oleic acid (OA) were stirred and degassed at 130° C. under vacuum for 1 hour to generate a yellowish stock of Cs-oleate precursor. Second, 0.2 milliliters (mL) Cs-oleate precursor, 10 mL n-hexane, 5 mL OA were loaded in a 50-mL three-neck flask, followed by mild degassing and nitrogen purging. Third, into the flask, a mixture of $PbBr_2$ (0.03 M, DMF, 1 mL), HBr (48 wt %, 15 microliters (μL)), 0.1 mL OA, and 0.05 mL oleylamine was swiftly injected under vigorous stirring. A color change from pale-white to green was observed in 10 min, suggesting the formation of $Cs_4PbBr_6$ PNCs. The HBr amount was varied to achieve PNCs with different PLQY. The as-synthesized nanocrystals were collected via centrifugation at 8000 revolutions per minute (rpm) for 3 minutes (min) (one-centrifugation-only purification process), followed by dispersion in 2 mL of toluene for further characterization. The 0D PNCs were then dispersed in HFE by measuring specific concentrations of weightPNC/volumeHFE, between about 6-15 milligrams per milliliter (mg/ml), and mixing the solution in a VWR Vortex mixer (3M Novec 7500) for 1 hr.

Solution preparation: the CsPbBr precursor solution was prepared by dissolving CsBr:PbBr in various molar ratios (ranging from 1.5:1 to 3:1) in DMSO and kept overnight for dissolution. PEO (10 mg/ml) was dissolved in DMSO. The $CsPbBr_3$ and PEO solutions were mixed in a 5:4 weight ratio. $LiPF_6$ salt (4 mg/ml in DMSO) was added to this solution in a 0.5% weight ratio.

Device fabrication: the ITO/glass substrates (about 20 Ohms per square (Ω/sq)) were cleaned in a sequence of non-ionic detergent wash, water bath sonication, and ultraviolet (UV) ozone treatment. Aqueous poly(3,4-ethylenedioxythiophene):polystyrene sulfonate (PEDOT:PSS) solutions (1.3-1.7%, Clevios AI 4083) were filtered through a 0.45 micrometer (μm) GHP filter and then spin-coated to obtain a ~20 nm thick film on the ITO-coated glass substrates. These films were subsequently annealed at 100° C. for 10 minutes in a dry $N_2$-filled glovebox. The prepared active layer precursor solution was spin cast onto the PEDOT:PSS layer at 1500 rpm for 75 seconds (sec), and after this time most of the DMSO is rinsed off from the 3D spin-coated films. The solution of 0D PNCs dispersed in HFE were introduced after about the 75th sec of spin coating and allowed to rest for 10 sec for proper mixing of 0D PNCs into 3D matrix, then followed by 30-sec spin coating at 2000 rpm. The spin-coated 3D-0D film was vacuum treated for 150 sec to allow all the solvents to be evaporated and then thermally annealed at 150° C. for 35 sec to obtain uniform crystalline 3D-0D thin film. The active layer thicknesses were generally in a range of from 125 nm-130 nm. Depositing 0D nanoparticles from HFE: In order to deposit the top electrode, samples were transferred to a vacuum chamber, and 10 Angstrom (Å) LiF and 800 Å Al were deposited using a shadow mask that defined 12 devices per substrate, each with a 3 square millimeter ($mm^2$) device area.

Electroluminescence measurements: The current-voltage electrical characteristics were obtained with a 760D electrochemical analyzer from CH Instruments (Austin, TX), with radiant exitance measurements acquired with a calibrated Labsphere integrating sphere equipped with a thermoelectric-cooled silicon photodetector and Keithley 6485 picoammeter. Each cyclic L-I-V sweep was performed at 0.1 Volts per second (V/sec) with 5 sec of interval between each scan. Electroluminescence spectra were measured with an Ocean Optics Jazz fiber spectrometer. Lifetime measurements were obtained with a custom multiplexer testing station capable of measuring 16 light emitting devices simultaneously. In brief, this instrument supplied constant current and measured voltage with custom circuitry and simultaneously captured radiant flux with a calibrated Hamamatsu photodiode (S2387-1010R) for each device.

Scanning Electron Microscopy (SEM): Secondary electron SEM images were taken with a Zeiss Supra-40 SEM using an in-lens detector at an accelerating voltage of 10 kilovolts (kV).

Atomic Force Microscopy: The AFM images were performed using a Veeco Model 3100 Dimension V to scrutinize the morphology of thin films. The thin films were scanned for 5 µm×5 µm area at 0.8 Hertz (Hz) rate using an OTESPA-R3 AFM tip from Bruker. Tapping mode AFM was used for this characterization.

X-Ray Diffraction (XRD): XRD measurements were collected using a Rigaku SmartLab X-ray Cu target (Ka1=1.54059 Å) and a HyPix 3000 detector.

The above summarize the materials and methods for the examples discussed in detail above in the Detailed Description and the results of which are shown in FIGS. 1(c)-11(b).

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A method of fabricating an active emissive layer configured for use in a light-emitting electrochemical cell (LEC), the method comprising:
   a) providing an intermediate three-dimensional (3D) thin film formed from a 3D perovskite precursor in a first solvent;
   b) modifying the intermediate 3D thin film to obtain a 3D-0D thin film by incorporating therein a pre-synthesized 0D perovskite nanocrystal (PNC) material dispersed in an orthogonal solvent; and
   c) annealing the 3D-0D thin film to obtain the active emissive layer configured for use in the LEC.

2. The method according to claim 1, wherein the first solvent is dimethyl sulfoxide (DMSO), and
   wherein the orthogonal solvent is hydrofluoroether (HFE) orthogonal solvent.

3. The method according to claim 1, wherein the 3D perovskite precursor comprises $CsPbX_3$ (where X=Cl, Br, or I), and
   wherein the $CsPbX_3$ is obtained from a mixture of CsX:$PbX_2$, at a first ratio of about 1.5:1.

4. The method according to claim 1, wherein the 3D perovskite precursor comprises $CsPbBr_3$, and
   wherein the $CsPbBr_3$ is obtained from a mixture of CsBr:$PbBr_2$, at a first ratio of about 1.5:1.

5. The method according to claim 1, wherein the pre-synthesized 0D PNC material is luminescent before it is incorporated into the intermediate 3D thin film.

6. The method according to claim 1, wherein a normalized photoluminescence (PL) intensity of the pre-synthesized 0D PNC material is about the same as a normalized PL intensity of a 3D material of the intermediate 3D thin film.

7. The method according to claim 1, wherein step b) comprises distributing 0D PNCs of the 0D PNC material dispersed in the orthogonal solvent into the intermediate 3D thin film by rotating the intermediate 3D thin film while the orthogonal solvent is provided thereto.

8. The method according to claim 1, wherein step c) comprises at least one of: vacuum annealing the 3D-0D thin film; and thermal annealing the 3D-0D thin.

9. The method according to claim 1, further comprising, after step c), sandwiching the active emissive layer between an anode and a cathode of the LEC.

* * * * *